United States Patent
Krause et al.

(10) Patent No.: US 12,218,713 B2
(45) Date of Patent: Feb. 4, 2025

(54) HIGH-FREQUENCY FEED LINE AND ELECTRONIC COMPONENT WITH HIGH-FREQUENCY FEED LINE

(71) Applicant: SCHOTT AG, Mainz (DE)

(72) Inventors: Andreas Krause, Vilsheim (DE); Karsten Droegemüller, Eichenau (DE)

(73) Assignee: SCHOTT AG, Mainz (DE)

( * ) Notice: Subject to any disclaimer, the term of this patent is extended or adjusted under 35 U.S.C. 154(b) by 184 days.

(21) Appl. No.: 18/164,749

(22) Filed: Feb. 6, 2023

(65) Prior Publication Data

US 2023/0179254 A1 Jun. 8, 2023

Related U.S. Application Data

(63) Continuation of application No. PCT/EP2021/071546, filed on Aug. 2, 2021.

(30) Foreign Application Priority Data

Aug. 4, 2020 (DE) .................. 10 2020 120 527.9
Apr. 21, 2021 (EP) .................................. 21169730

(51) Int. Cl.
*H04B 3/52* (2006.01)
*H04B 3/56* (2006.01)

(52) U.S. Cl.
CPC ............... *H04B 3/52* (2013.01); *H04B 3/56* (2013.01)

(58) Field of Classification Search
CPC .. H04B 3/52; H04B 3/56; H05K 2201/09272; H05K 2201/09727; H05K 1/0242
See application file for complete search history.

(56) References Cited

U.S. PATENT DOCUMENTS

| 6,642,819 | B1 | 11/2003 | Jain |
| 2006/0091973 | A1 | 5/2006 | Zimmerling |
| 2007/0063782 | A1 | 3/2007 | Kanno |
| 2007/0133933 | A1 | 6/2007 | Yoon |
| 2008/0048797 | A1* | 2/2008 | Matters-Kammerer ..... H01P 7/084 333/204 |

(Continued)

FOREIGN PATENT DOCUMENTS

| CN | 100536226 | 9/2009 |
| DE | 102005038456 | 5/2006 |

(Continued)

OTHER PUBLICATIONS

English translation of Written Opinion dated Dec. 6, 2021 for International Patent Application No. PCT/EP2021/071546, 6 pages.

(Continued)

*Primary Examiner* — Sung S Ahn
(74) *Attorney, Agent, or Firm* — Ruggiero McAllister & McMahon LLC

(57) ABSTRACT

A conductor track arrangement for high-frequency signals is provided. The arrangement has a carrier and a layered signal conductor arranged on the carrier. The layered signal conductor is delimited by a first end, a second end, an inner edge, and an outer edge. The layered signal conductor changes direction in a deflection area and has a minimum width in the deflection area. At least one of the inner and outer edges has a curvature in the deflection area. The deflection area is between the first and second ends.

20 Claims, 15 Drawing Sheets

(56) References Cited

U.S. PATENT DOCUMENTS

2019/0043816 A1* 2/2019 Sutono .................. H01L 23/66

FOREIGN PATENT DOCUMENTS

| WO | 2007000934 | 1/2007 |
| WO | 2014089823 | 6/2014 |

OTHER PUBLICATIONS

English translation of International Preliminary Report on Patentability dated Feb. 7, 2023 for International Patent Application No. PCT/EP2021/071546, 7 pages.

English translation of International Search Report dated Dec. 6, 2021 for International Patent Application No. PCT/EP2021/071546, 2 pages.

* cited by examiner

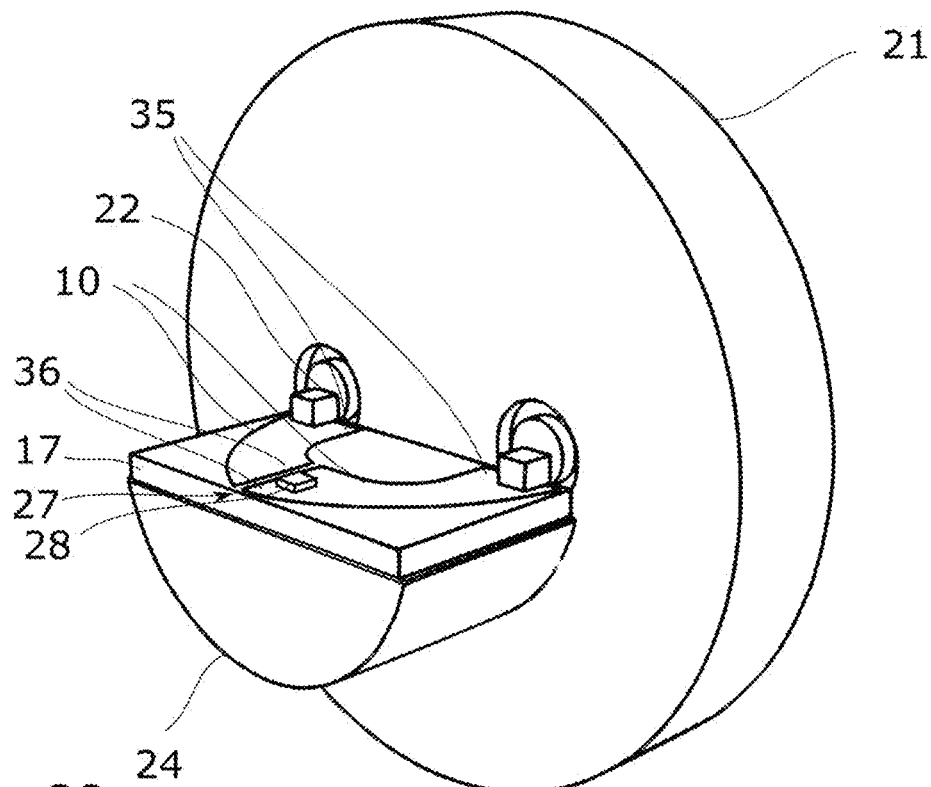
Fig. 29
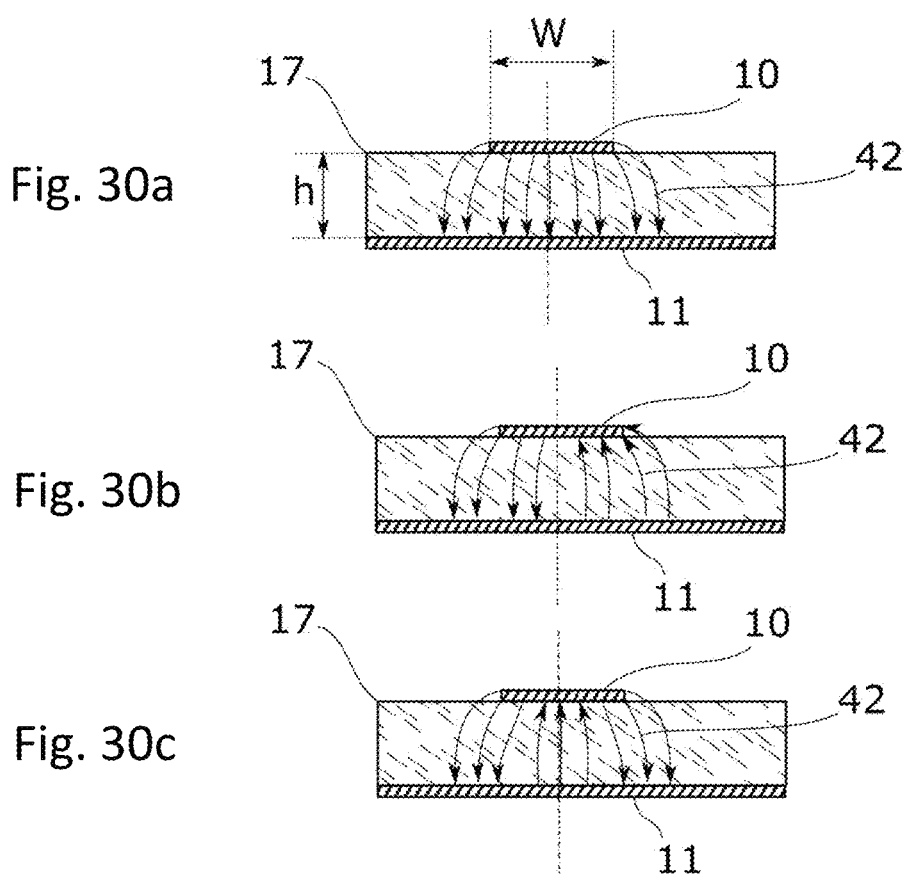
Fig. 30a
Fig. 30b
Fig. 30c

HIGH-FREQUENCY FEED LINE AND ELECTRONIC COMPONENT WITH HIGH-FREQUENCY FEED LINE

CROSS REFERENCE TO RELATED APPLICATIONS

This application is a continuation of International Application PCT/EP2021/071546 filed Aug. 2, 2021, which claims the benefit under 35 USC § 119 of German Application 10 2020 120 527.9 filed Aug. 4, 2020 and European Application 21169730.5 filed Apr. 21, 2021, the entire contents of all of which are incorporated herein by reference.

BACKGROUND

1. Field of the Invention

The invention relates in general to high-frequency feed lines. In particular, the invention relates to high-frequency feed lines having changes of the direction of the course. Furthermore, the invention relates to electronic components having such high-frequency feed lines.

2. Description of Related Art

High-frequency feed lines are known in principle. In particular, such feed lines are required to supply electronic components with data. This is described, for example, in the application DE 10 2020 105 772.5 of the applicant.

In such cases, high-frequency feed lines arranged on a submount are used, which comprise a signal conductor and a ground conductor.

Such conductor tracks and their properties are described, for example, in Agilent Technologies, Advanced Design System 1.5, Circuit Components, Distributed Components, chapter 2 (to be found under the Internet address http://literature.cdn.keysight.com/litweb/pdf/ads15/ccdist/ccdist026.html).

Depending on the arrangement and interconnection of the components to be supplied, a direction change of the lines can be necessary for reasons of geometry. The problem exists here that capacitance changes can occur along the line due to the deflection. These capacitance changes can result in an undesired increased return loss. An abrupt 90° change even results in significant reflection. If the direction is to change by 90°, it is thus provided according to the prior art that the outside of the conductor track is at a deflection angle of 45° in each case to the previous and to the new propagation direction, so that a deflection section diagonal to both propagation directions, or a chamfer, results. A further option is providing a rounded line section. However, this option has the disadvantage of requiring more space.

On the other hand, a formation of the deflection having a 45° chamfer is disadvantageous in that the deflection section acts as an antenna, so that reflection losses occur in the deflection area of the conductor. The bandwidth of the high-frequency signals transmittable on the conductor is also limited by such a formation of the deflection.

In addition to reflection losses, higher-order waves can also occur at very high frequencies, or can propagate from a specific limiting frequency, so that not only the fundamental wave, but also higher-order waves propagate on the line. The fundamental wave and all higher-order waves are referred to as natural waves of the line. On an undisturbed line, the natural waves are independent and do not interfere. However, in the event of interference, coupling of the natural waves occurs so that the properties of the fundamental wave also change as soon as a higher-order wave propagates. If a line is thus no longer uniform or is inhomogeneous in the propagation direction, higher-order waves are excited. A direction change represents such an inhomogeneity. In the case of a line angle, this is therefore also referred to as a discontinuity. In the case of the above-mentioned 45° chamfer, a compensation of the capacitance is achieved by the inclination, thus by an abrupt change of the conductor track cross section. Therefore, higher-order waves are excited at correspondingly high frequencies at this line angle.

SUMMARY

The invention is therefore based on the object of providing a high-frequency feed line which, in comparison to the prior art, has lower reflection losses in deflection areas and also preferably a higher limiting frequency for higher-order waves and permits the use of a higher bandwidth in comparison to the prior art.

Accordingly, a conductor track arrangement for high-frequency signals is provided, having a carrier and a layered signal conductor, which is arranged on the carrier, is delimited by at least one inner edge and at least one outer edge, and extends from one end to another end of the signal conductor, and preferably a ground conductor arranged on the carrier, wherein the signal conductor of the conductor track arrangement changes its direction in a deflection area between the ends, in particular between two legs, and has a width, wherein the width in the deflection area of the signal conductor is less at least in sections than a width at at least one of the ends of the signal conductor, so that the actually elevated capacitance in the deflection area is compensated for. The width of the signal conductor in the deflection area can also be less than the width of the signal conductor at the end, in particular both ends of the signal conductor.

The term leg is typically understood here as an in particular straight section of the signal conductor, which preferably does not have a direction change, and/or as a section which is defined by an inner edge and an outer edge, neither of which has a direction change. The inner edge and the outer edge of a leg can have the same length, or the inner edge is formed longer than the outer edge, or the outer edge is formed longer than the inner edge of a leg. Each leg preferably extends from one end of the signal conductor up to the deflection area.

One embodiment provides a conductor track arrangement for high-frequency signals, having a carrier and a layered signal conductor, which is arranged on the carrier, is delimited by at least one inner edge and at least one outer edge, and extends from one end to another end of the signal conductor, wherein the signal conductor of the conductor track arrangement changes its direction in a deflection area between the ends and has a minimum width, wherein the minimum width is less in the deflection area of the signal conductor than the widths at the ends of the signal conductor, and wherein at least one of the edges is curved at least in sections in the deflection area. Due to the reduction of the conductor track width, less metal can be used for the signal conductor in the deflection area, by which the typically elevated capacitance in the deflection area can be compensated for. The outer edge and the inner edge can advantageously be curved at least in sections in the deflection area. The elevated capacitance in the deflection area can be compensated for more strongly in this way.

In one embodiment, it is therefore also provided that the minimum width is reduced in relation to the width at one of the ends of the signal conductor by a factor in the range of 0.5 to 0.95, preferably in the range of 0.6 to 0.8.

To make the compensation of the capacitance individually adaptable, at least one of the following features is provided: the curvature of the inner edge and the curvature of the outer edge each have a center, wherein the center of the curvature of the inner edge and the center of the curvature of the outer edge are arranged offset in relation to one another, in particular so that the curvature of the inner edge and the curvature of the outer edge are formed eccentrically in relation to one another, in particular the centers differ from one another, the radius of the curvature of the outer edge is greater than the radius of the curvature of the inner edge, the curvature of the outer edge and/or the inner edge is formed continuously, in particular uninterruptedly, the curvature of the outer edge and/or the inner edge is steady, the curvature of the outer edge and/or the inner edge is unsteady, the width of the signal conductor changes steadily in the deflection area, wherein the course of the width is preferably steadily differentiable at least twice, the minimum width of the signal conductor is within the middle third of the deflection area, preferably in the middle of the deflection area.

The width of the signal conductor in the deflection area, or between at least one curved edge and the other edge, preferably between two curved edges, is defined in terms of the invention by the distance of a tangent of the inner curvature of the inner edge to the tangent of the inner curvature of the outer edge, in particular defined by a common perpendicular of the tangent of the inner curvature of the outer edge and the tangent of the inner curvature of the inner edge. The one perpendicular is preferably perpendicular in this case, thus at an angle of 90°, to the two tangents of the inner curvatures, wherein the length of the perpendicular corresponds to the width of the signal conductor, or the distance of the inner edge to the outer edge.

In one preferred embodiment, it is provided that the curvature of the inner edge and the curvature of the outer edge can be arranged concentrically to one another, the curvatures of the outer edge and the inner edge have a common center. In another embodiment, the curvature of the inner edge and the curvature of the outer edge can be formed eccentrically in relation to one another, in particular non-concentrically, and preferably in such a way that the width of the signal conductor is less in the deflection area than at one end, preferably both ends of the signal conductor. This results in an increase of the limiting frequency of the higher-order waves, so that the higher-order waves first arise at a higher frequency and the fundamental wave is no longer disturbed or is only slightly disturbed. If the width of the signal conductor changes steadily and/or the outer edge and the inner edge are curved throughout, in particular continuously, moreover a capacitance jump can be avoided, and therefore a capacitance compensation also can take place without an abrupt jump of the conductor track cross section.

The shape of the signal conductor can advantageously also be adapted to the geometric formation of the submount, without having to dispense with the above-mentioned advantages. For this purpose, it is provided that the signal conductor in the deflection area, or the deflection area, is formed asymmetrically, or symmetrically, in particular in such a way that the deflection area has a mirror axis along the angle bisector of the deflection angle. The deflection area can also extend from one end to the other end of the signal conductor. In this way, the signal conductor can be formed curved over its entire length, for example, so that the signal line is not disturbed by a kink.

According to a further embodiment, a conductor track arrangement for high-frequency signals is provided, having a carrier and a layered signal conductor, which is arranged on the carrier and is delimited by two edges, as well as a ground conductor arranged on the carrier, wherein the signal conductor of the conductor track arrangement changes its direction in a deflection area between two legs, wherein in the deflection area, at least one of the edges of the signal conductor has at least two deflection sections, which are at an angle in relation to one another. Accordingly, an at least two-step deflection of the edge in the new direction is provided.

It has surprisingly been shown that in this way not only can the return loss be reduced. A fine adjustment can also be performed with the formation of the deflection sections, so that the impedance can be adapted to the provided signal frequency.

To combine the above-mentioned advantages of the reduction of the return loss and the reduced capacitance, it can also be provided that one edge, for example, the inner or outer edge, is curved at least in sections and the other edge, preferably the outer edge or inner edge, has at least two or more deflection sections.

In one particularly preferred embodiment, the signal conductor is deflected by 90°, or by an angle close to 90°. It is especially provided here that the deflection in the deflection area takes place by an angle in the range of 75° to 105°, preferably 90° as stated.

The conductor track arrangement is advantageously designed as a microstrip line, as a coplanar waveguide, or as a CBCPW arrangement. A conductor track arrangement designed as a microstrip line is preferred. This enables a particularly compact construction, and in particular also simple production having comparatively few manufacturing steps.

In coplanar waveguides or CBCPW arrangements, the conductor track arrangement preferably comprises for this purpose a layered ground conductor in particular, which is arranged opposite to the layered signal conductor, wherein at least one of the following features applies to the distance between ground conductor and signal conductor: the distance is in the range from 0.025 mm to 0.5 mm, preferably in the range from 0.05 mm to 0.4 mm, the width at one end of the signal conductor is greater by a factor in the range of 0.5 to 7.5, preferably in a range of 0.6 to 5 than the distance between ground conductor and signal conductor, the ratio of the distance between signal conductor and ground conductor to the difference of the width of the signal conductor at one of its ends (35, 36) and the minimum width of the signal conductor has a value in the range of 0.5 to 2.

These ranges are particularly advantageous at provided impedances between 15 ohm and 65 ohm, in particular between 20 ohm and 60 ohm, or even at precisely 20 ohm or 60 ohm. Such value ranges are preferred when the signal conductor is arranged on a submount, preferably made of glass or ceramic, in particular ALN or $Al_2O_3$, wherein the submount can typically have a thickness between 0.025 mm and 0.5 mm.

Since the width of the signal conductor and the distance of the signal conductor to the ground conductor influence the capacitance to a large extent, the capacitance can be set using the above-mentioned values of these parameters optimally to a desired application, but in particular to particularly good signal transmission at very high frequencies, for example, at greater than 80 GHz. The conductor track arrangement is therefore designed in such a way that a limiting frequency, in particular the occurrence of higher-order waves, is above 60 GHz, preferably above 70 GHz. This applies in particular to the design of the line curvature of the signal conductor and/or a reduced width $W_{min}$ in the deflection area, in particular in conjunction with curved edges 2, 3. The invention will be explained in more detail hereinafter on the basis of the appended figures.

BRIEF DESCRIPTION OF THE FIGURES

FIG. 29 schematically shows a signal conductor for use in a TO housing.

FIGS. 30a, 30b, and 30c show a submount in cross section with different electric fields.

DETAILED DESCRIPTION

Figure 1:
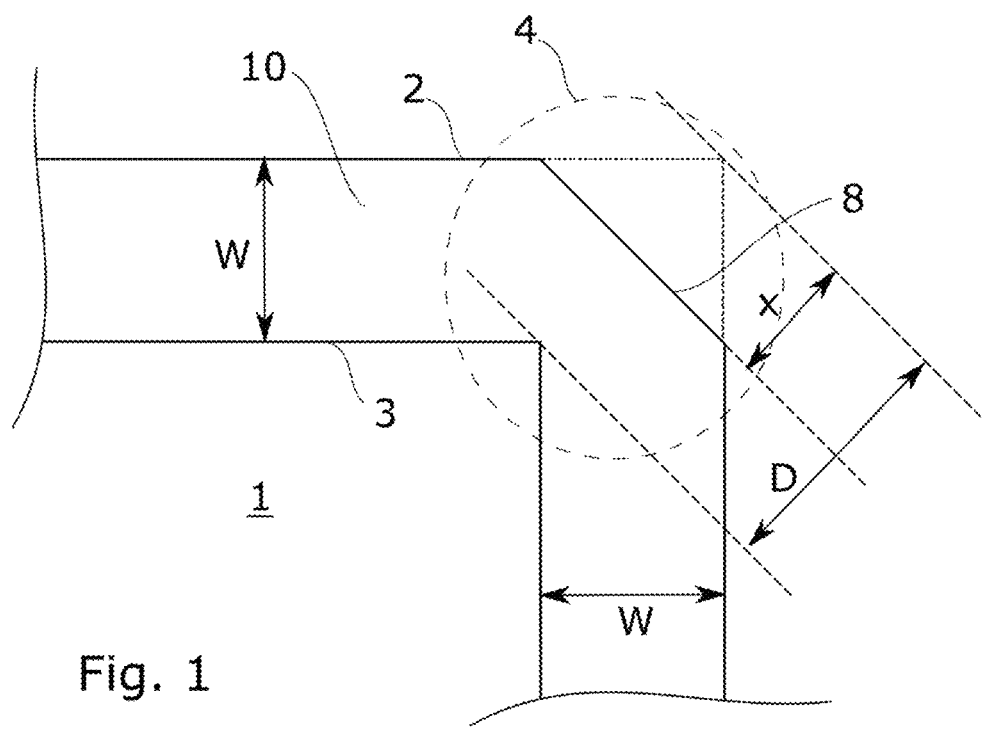
FIG. 1 shows the geometry of a conductor track arrangement having a 45° deflection according to the prior art.

FIG. 1 shows the signal conductor 10 of a conductor track arrangement 1 having a deflection by 90° in relation to the previous and the new propagation direction in a deflection area 4, or a deflection area having an inclination of the outer edge. The conductor track-shaped or layered signal conductor 10 has an outer edge 2 and an inner edge 3. In the deflection area 4, the outer edge 2 bends by a deflection angle of 45° in relation to the previous propagation direction, so that the contour of the conductor has an inclination 8.

If the signal conductor 10, as shown in FIG. 1, has a width W, an angular connection thus has a width D of the signal conductor 10 along the mirror axis, which results due to the inclination by a value X, and as a result of the described formation of the deflection, an inclination X arises. According to the cited source from Agilent Technologies, the following applies for the optimal inclination:

$$\frac{X}{D} = 0.52 + 0.65 \times e^{-1.35 \times \frac{W}{H}}$$

H designates the thickness of the conductor track here. The following obviously applies for D: D=√2×W For typical dimensions of W=500 μm and H=150 μm, the following is obtained for the inclination X:

$$X=372.8 \text{ μm}$$

This is used hereinafter as the reference model.

Figure 2:
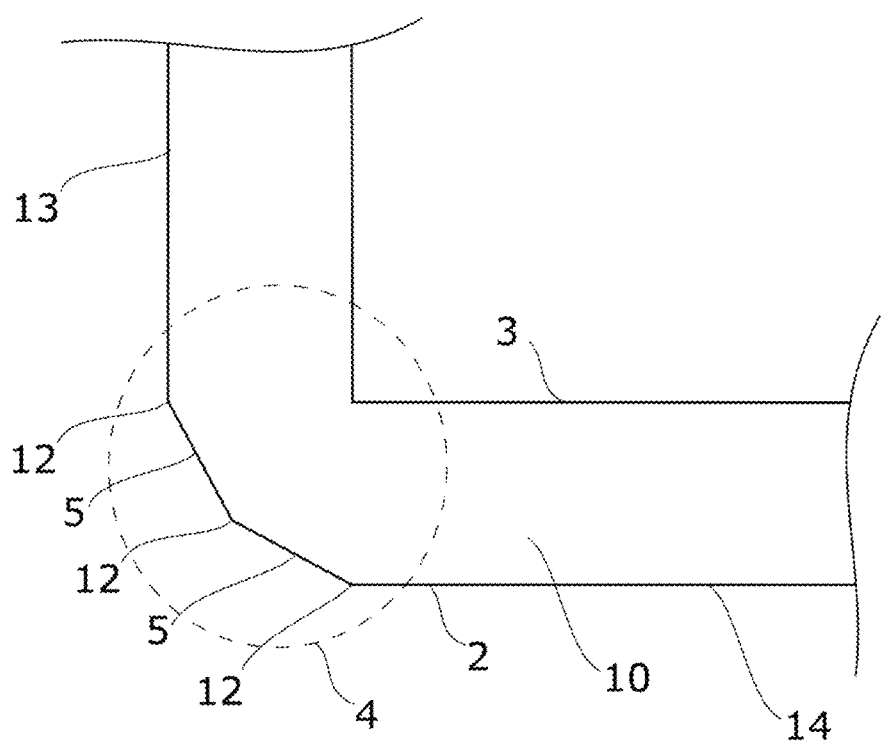
FIG. 2 shows a conductor track arrangement having two deflection sections on the outer edge in the area of the deflection.

FIG. 2 shows an example of a signal conductor 10 of a conductor track arrangement for high-frequency signals according to this disclosure. The signal conductor 10 is formed in general as a flat, in particular layered conductor, for example in the form of a conductor track. As in FIG. 1, the signal conductor 10 is shown in a top view. The elongated signal conductor 10 has a deflection area 4, which connects two legs 13, 14 and in which the signal conductor 10 changes its direction. Due to the direction change, the legs 13, 14 are at an angle to one another. As also in the example of FIG. 1, the direction change is 90°. The signal conductor 10 is delimited by two edges 2, 3. One of the edges, namely edge 2, forms an outer edge, the other edge 3 is an inner edge. An outer edge is defined in that the direction change of the signal conductor 10 leads it away from the outer edge. At the inner edge, the direction change has the result that a straight line laid on the inner edge intersects the signal conductor 10 in the deflection area 4. In other words, the contour of the outer edge 2 is overall convex in the deflection area, the contour of the inner edge 3 is overall concave.

The example of FIG. 2 is based on an embodiment in which the outer edge 2 has two deflection sections 5, which are at an angle to one another. In particular, the deflection sections 5 are preferably linear or slightly curved.

According to a further, general embodiment, which is also implemented in the example of FIG. 2, at least two deflection sections 5 are connected by a corner 12. The deflection sections 5 are at an angle to one another due to the corner. According to still a further embodiment, also implemented in the example of FIG. 2, the respective edge 2 or 3 emerges via a corner 12 into a deflection section 5. A corner as a punctiform structure in the mathematical meaning is not possible in the structuring of real conductor tracks. A corner is therefore understood more generally as a section of the edge 2 or 3, the length of which is at most 1/10 of the length of the shorter of the adjoining deflection sections 5.

Figure 3:
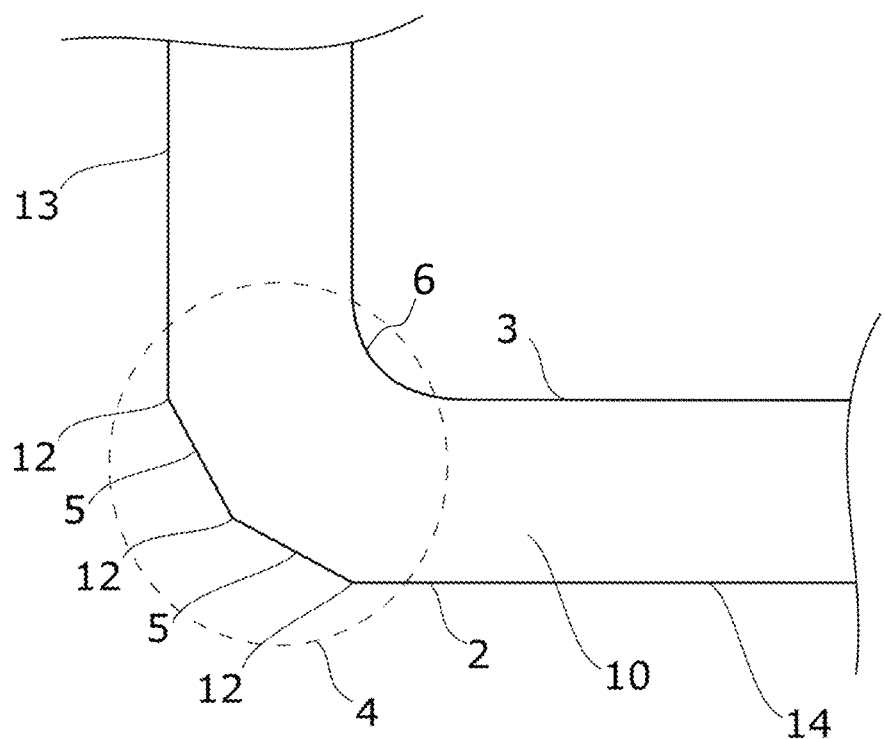
FIG. 3 to FIG. 8 show various other embodiments of the conductor track arrangement having different numbers of deflection sections on the inner or the outer edge.
Figure 4:
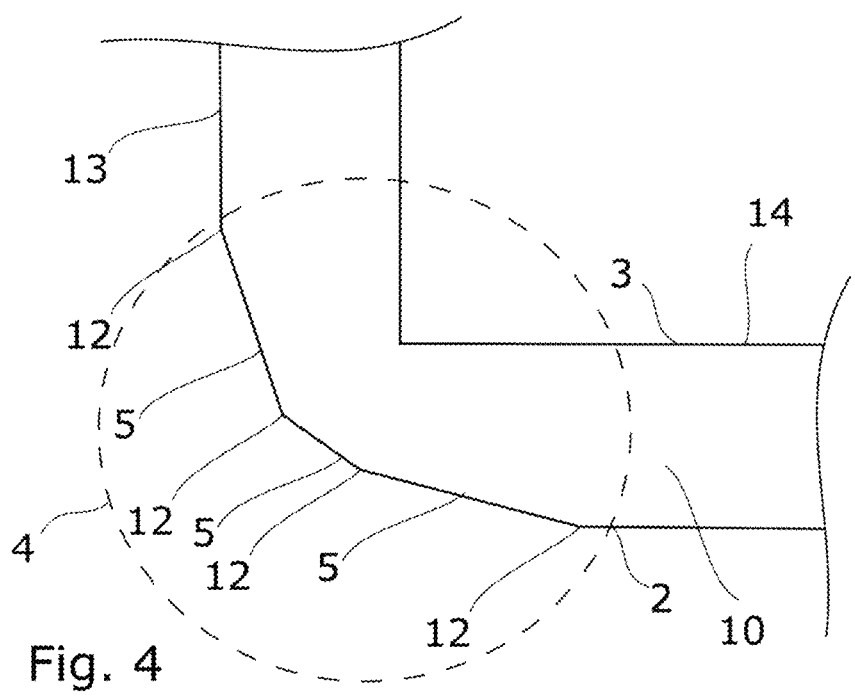

The signal conductor 10 according to FIG. 4 has three deflection sections 5 at the edge 2 in the deflection area 4, wherein the edge 2 forms the outer edge. The other edge 3, which forms the inner edge, has no deflection sections 5 as in an example shown in FIG. 3. Overall, a change of the line direction by 90° results. The deflection sections 5 are each inclined by various angles in relation to one another.

In the embodiment shown in FIG. 3, the signal conductor 10 has at least one curved deflection section 5, 6 in the deflection area 4, and thus in particular no straight or angled deflection sections at the respective edge 2, 3 which has the curved deflection section. In the embodiment shown, the inner edge 3, that is to say in particular at least one deflection section 6 of the inner edge 3, is formed curved. However, multiple deflection sections, which are at an angle to one another, for example, can also be curved. This curved deflection section 5 or these curved deflection sections 5 can be located at the inner edge 2 and/or at the outer edge 2. In general, without restriction to the examples shown in the figures, the inner edge 2 and/or the outer edge 2 can have deflection sections. In other words, deflection sections 5 can only be arranged at the outer edge 2, for example, or only one edge, for example the outer edge 2, has to be modified or optimized to promote improved return loss.

Figure 5:
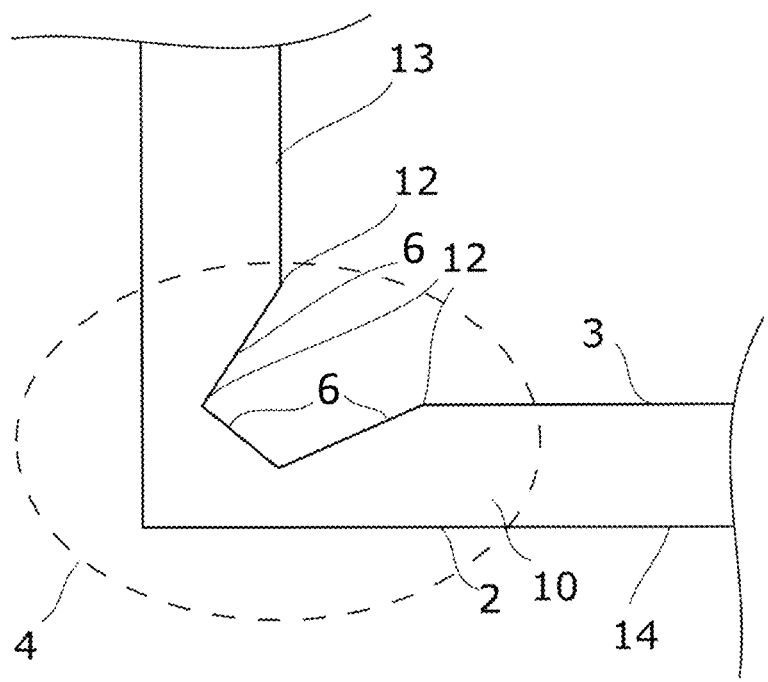

In addition, in general according to still a further embodiment, as in the example of FIG. 4, the deflection sections 5 can have different lengths. In contrast to the embodiments previously shown, in the example shown in FIG. 5, deflection sections 6 are provided at the edge 3, which forms the inner edge.

Furthermore, it is possible according to one embodiment that at least one deflection section 5, 6 is inclined or extends counter to the deflection direction of the signal conductor 10. This embodiment is also implemented in the example shown in FIG. 5. In this example, these are the two inner deflection sections 6, in particular two inner deflection sections 6 are opposite to one another.

Figure 6:
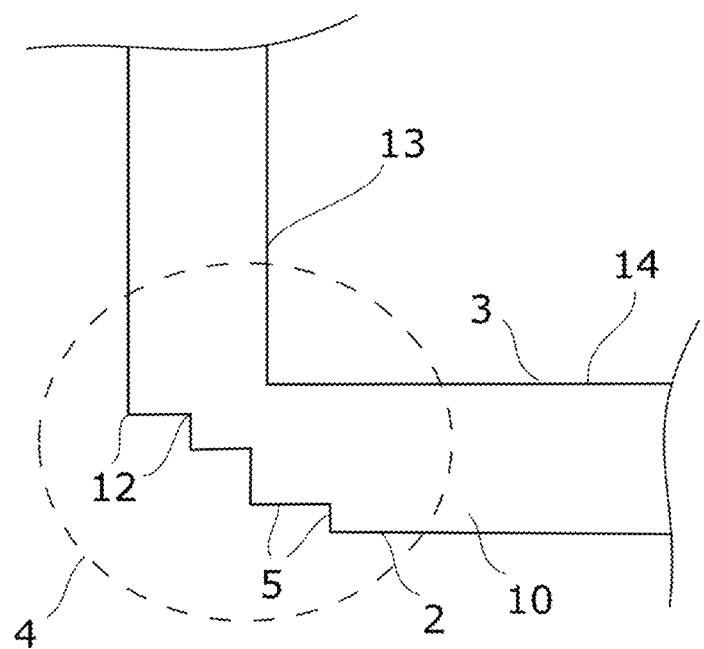

In the example shown in FIG. 6, deflection sections 5 are also provided which extend counter to the deflection direction, but at the outer edge here. In the example, these are every second deflection section 5. In the example, the edge 3 is formed in the deflection area 4 by multiple short deflection sections 5 arranged at right angles to one another, so that a stepped formation results at the outer edge. Overall, six deflection sections are provided in the deflection area 4. Overall, a change of the signal conductor 10 by 90° results.

Figure 7:
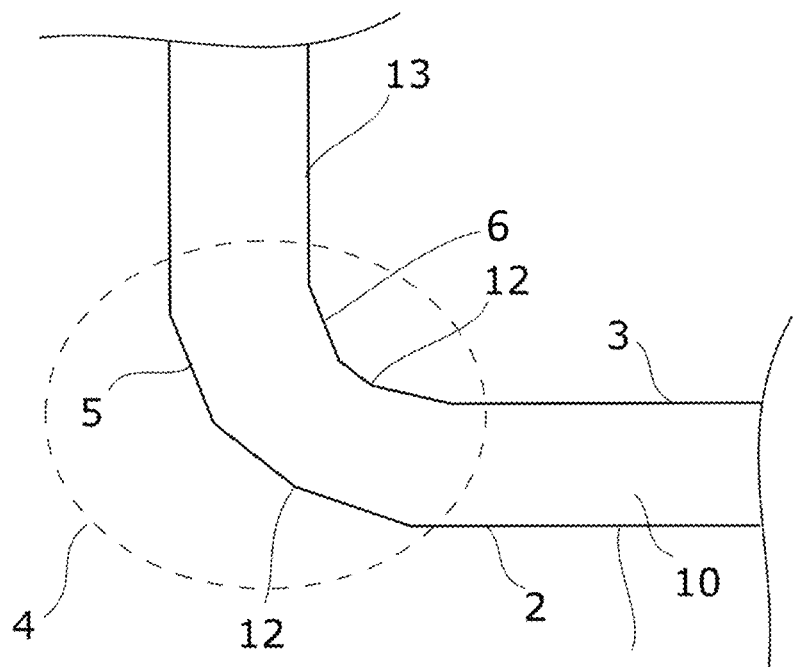

In the example shown in FIG. 7, both edges 2, 3 have deflection sections 5, 6. In addition, more than two deflection sections 5, 6, namely three deflection sections 5, 6 in each case, are provided at each of both edges 2, 3. However, more than three deflection sections 5, 6 can also be provided, preferably at the outer edge 2 or the inner edge 3, in particular in such a way that a large number of deflection sections 5, 6 approximates a curved edge.

Figure 8:
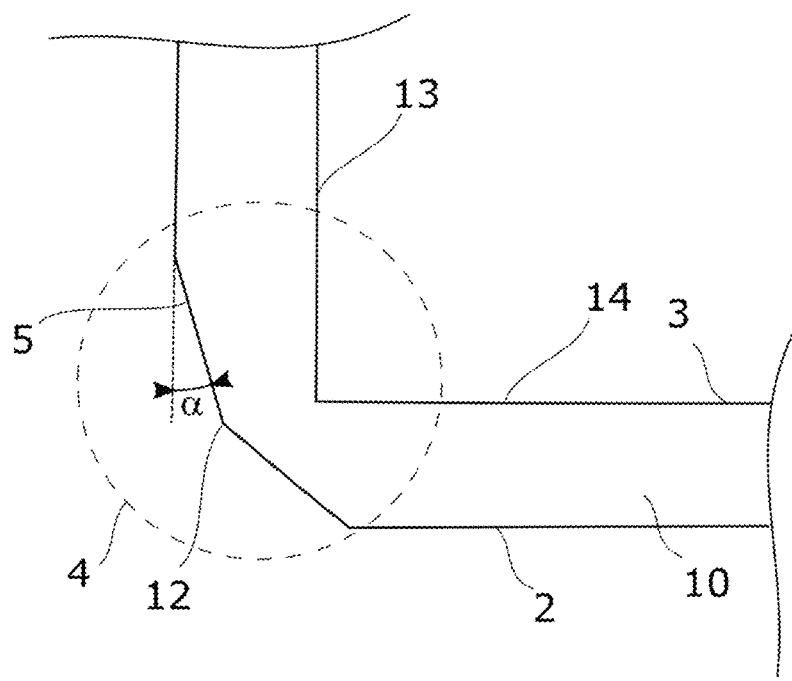

FIG. 8 shows an example of a particularly preferred embodiment of the conductor track arrangement according to the invention, or of the signal conductor 10 of the conductor track arrangement. This embodiment is based on the deflection area 4 being formed asymmetrically. In particular, a mirror axis is not provided as a line of symmetry. In contrast thereto, for example, the deflection area of the example of FIG. 2 has a mirror axis along the angle bisector 38 of the deflection angle, in particular the edge 3. While the inner edge 3 of the signal conductor 10 has no deflection sections in the deflection area 4, the outer edge 2 has two deflection sections 5 of unequal length in the deflection area, wherein the edge from the leg 13 to the first deflection section 5 has a direction change by a deflection angle $\alpha$. In the illustrated example, this direction change or the deflection angle $\alpha$ is approximately 16°. In general, without restriction to the illustrated example, it is provided here according to still another embodiment that the direction change or the deflection angle at one edge 2, 3, preferably at the outer edge 2 at the transition from one leg 13, 14 to the adjoining deflection section 5, is less than 45°, preferably less than 40°.

Figure 9:
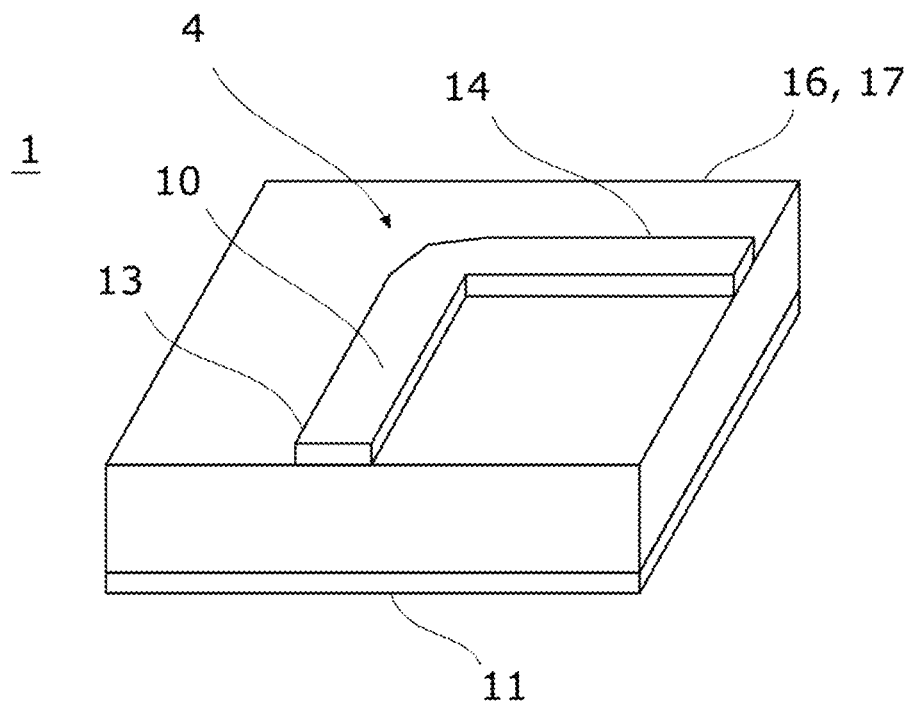
FIGS. 9 to 11 show various configurations of conductor track arrangements.
Figure 10:
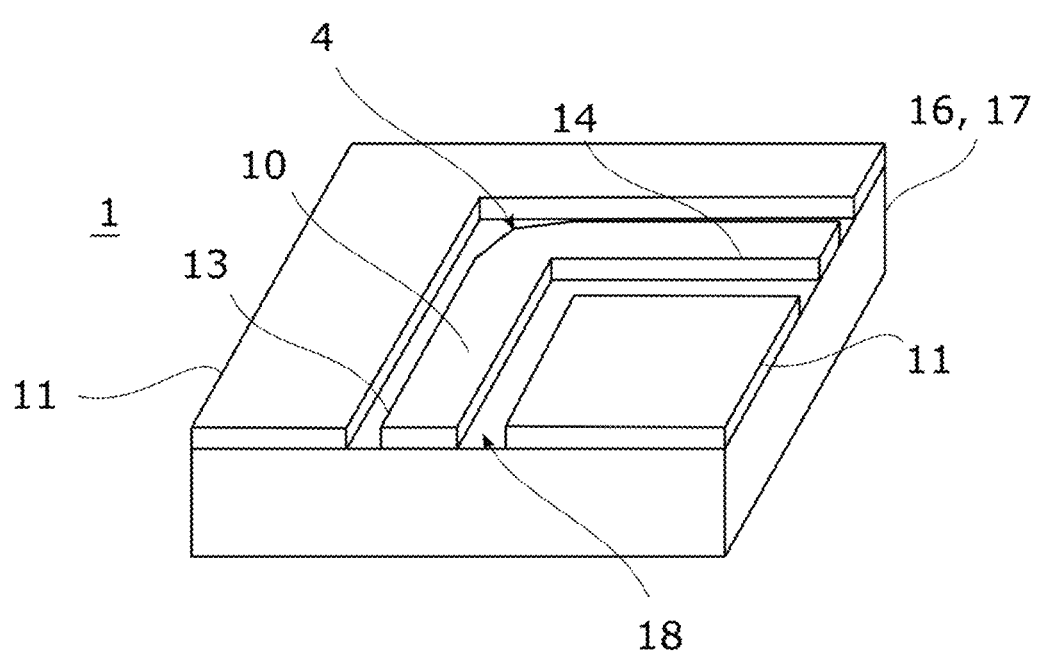
Figure 11:
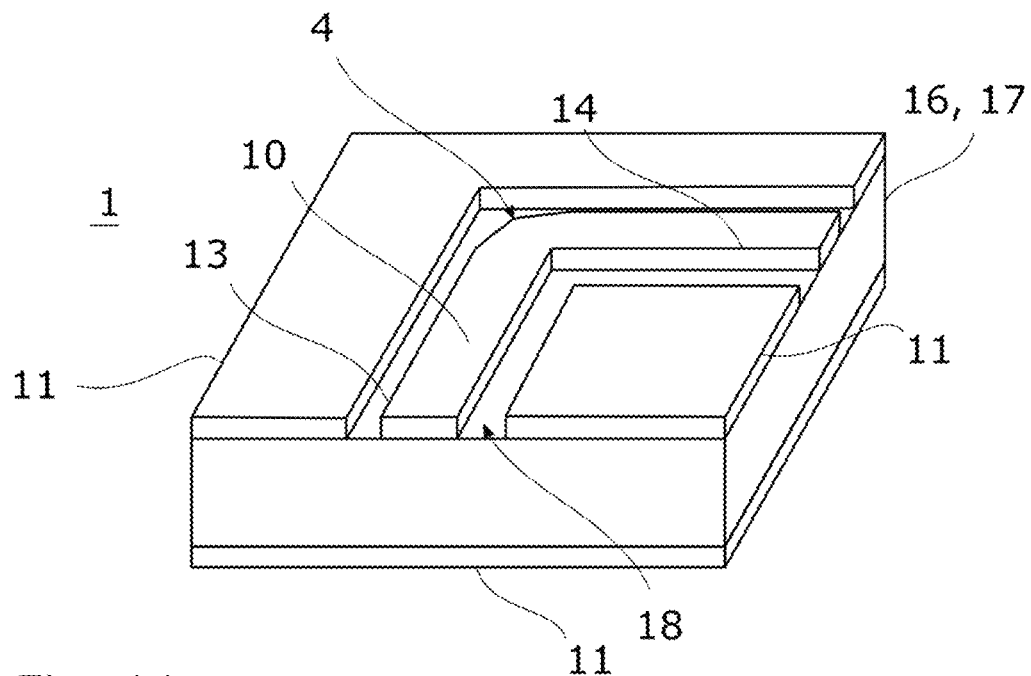

Preferred configurations of conductor track arrangements 1 are shown in FIGS. 9 to 11. One example of a particularly preferred configuration is shown in FIG. 9. The signal conductor 10 and the ground conductor 11 are arranged on opposite sides of the carrier 16. Such a configuration is known in principle to a person skilled in the art as a so-called microstrip line. In general, the carrier 16 can be a submount 17. Such a submount can be arranged on a socket of a housing for an electronic component. In particular a socket for a TO housing (TO=transistor outline) is considered here. The shape of the signal conductor 10 having two deflection sections at the outer edge corresponds to the example of FIG. 2.

The submount 17 can be manufactured, for example, from aluminum nitride ceramic, more generally a ceramic containing aluminum nitride, or aluminum oxide ($Al_2O_3$). Other materials having good thermal conductivity can also be used, for example glass or glass and ceramic. A submount 17 made of glass can also be used for the high-frequency line. Particularly thin glass can be suitable due to the low thickness. At thicknesses of the submount less than 0.2 mm, for example, the significantly worse thermal conductivity can be partially compensated for. The so-called thermal resistance is decisive. The thinner a substrate, the lower is its thermal resistance.

The configuration of FIG. 10 is based on the signal conductor 10 and the ground conductor 11 being arranged on the same side of the carrier 16. The signal conductor 10 extends here in a gap 18 in the ground conductor 11. The example thus represents a coplanar conductor track arrangement (CPW="coplanar waveguide").

FIG. 11 shows a variant of a coplanar conductor track arrangement 1. In this case, in addition to the conductor tracks of the ground conductor 11 arranged coplanar to the signal conductor 10, a conductor track of the ground conductor 11 arranged on the opposite side of the carrier 16 is also provided. Such an arrangement is designated as a CBCPW ("conductor backed coplanar waveguide"). All exemplary embodiments share the feature that the deflection takes place in at least two steps.

A comparison of the return loss of a conductor track arrangement according to this disclosure to other arrangements is explained hereinafter. For this purpose, FIG. 12 shows the return loss computed using a simulation computation as a function of the signal frequency for three different arrangements.

Figure 12:
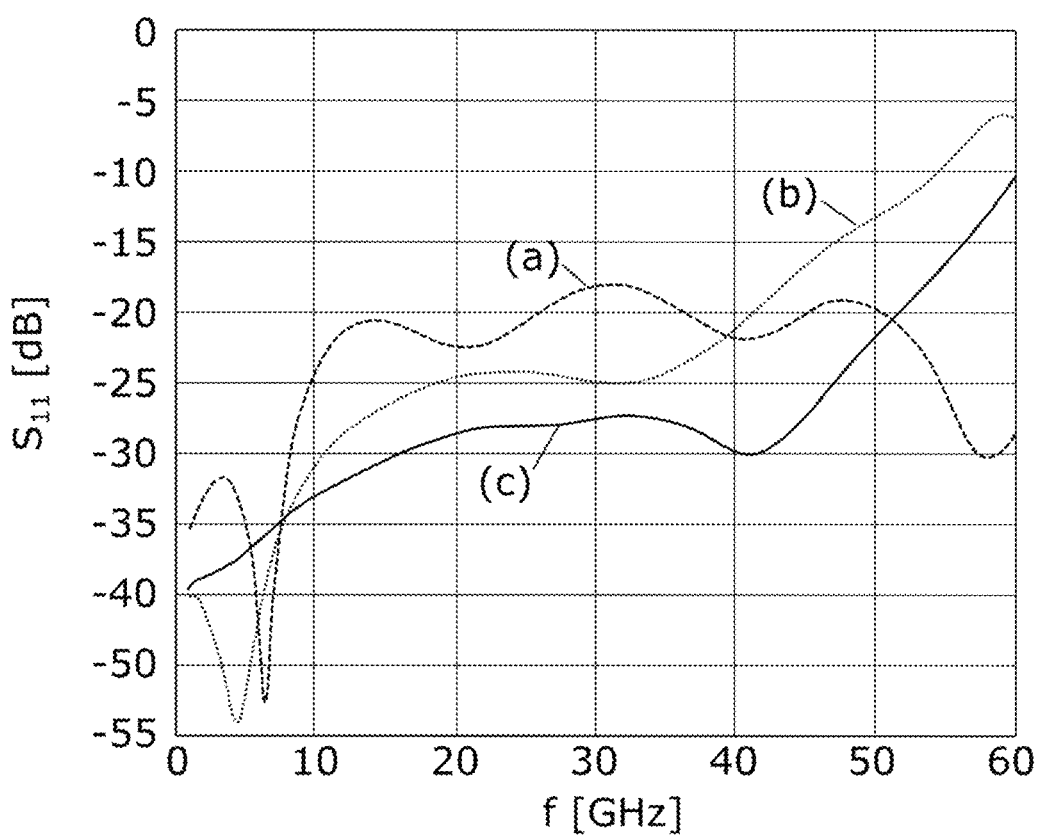
FIG. 12 shows the return loss as a function of the signal frequency for three different conductor track configurations.

Curve (a) in FIG. 12 shows the return flow for a deflection area which is provided with a rounded outer edge. The largest possible bandwidth is achieved here when the radius of curvature is wider than the conductor track, thus when the following applies:

$$\frac{\text{Radius of curvature}}{\text{Width of the conductor track strip}} \geq 1$$

Curve (b) is the return loss for a deflection area having a single 45° inclination, thus a deflection area as shown in the example of FIG. 1.

Curve (c) shows the return loss at an asymmetrical two-step deflection according to this disclosure, thus an example similarly as in the signal conductor 10 according to FIG. 8. The deflection angle α between the edge at the leg 13 and the first deflection section is 30° here. The signal flow direction is from the leg 13 via the deflection area 4 into the leg 14. The width 10 of the signal conductor tracks 10 at the legs 13, 14 is 0.6 mm in all examples.

As is apparent on the basis of FIG. 12, the return loss of the conductor track arrangement 1 having two deflection sections 5 and asymmetrical deflection area, in a broad frequency range from 10 GHz to 50 GHz, is significantly lower than in the comparative arrangements.

Figure 13:
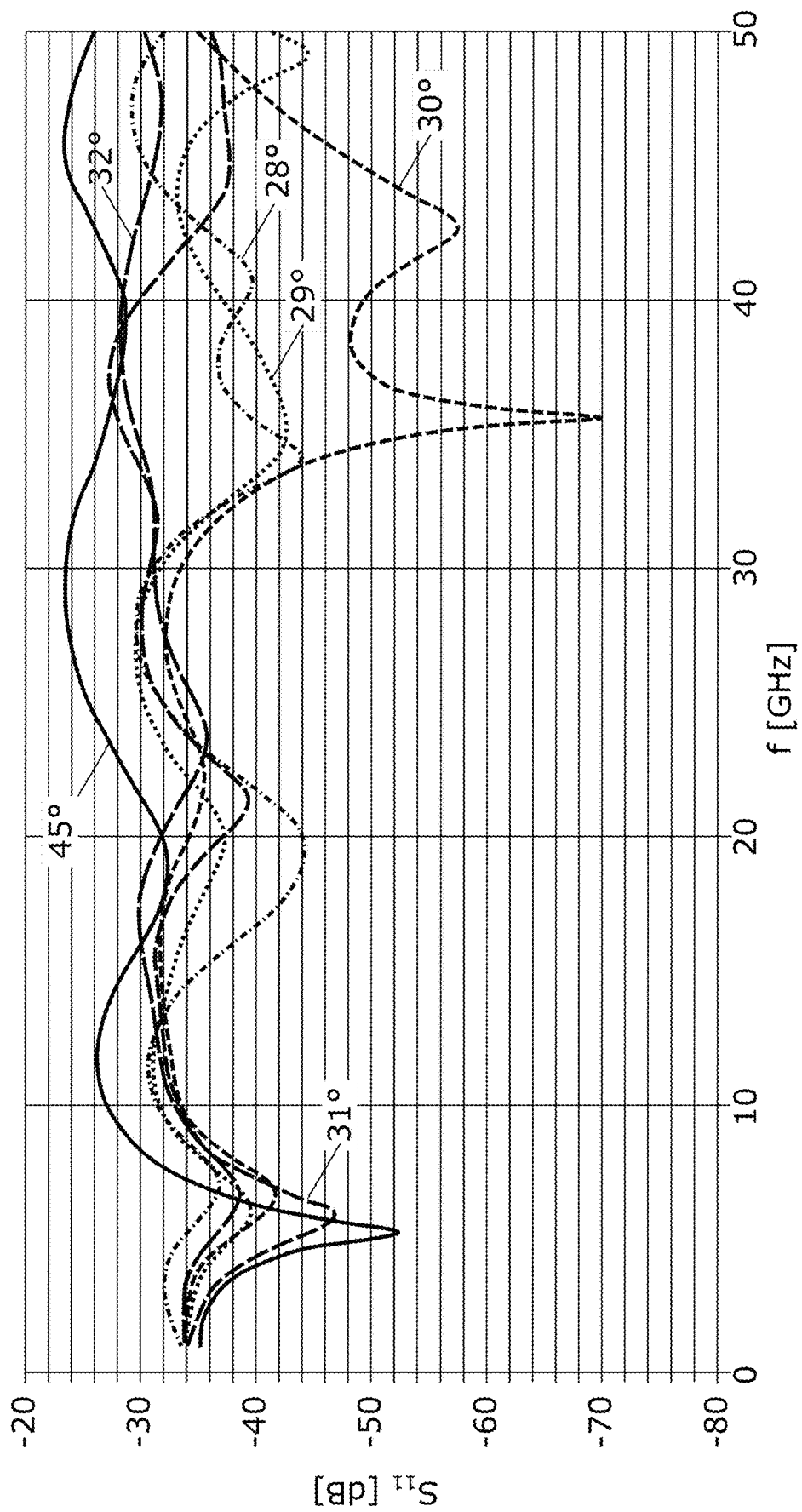
FIG. 13 shows the return loss as a function of the signal frequency for various deflection angles of a deflection section.

The influence of the deflection angle α of the deflection section 5 on the adjoining edge of the leg 13 is discussed on the basis of FIG. 13. FIG. 13 shows for this purpose the return loss in dB as a function of the signal frequency for various deflection angles α of the deflection section 5. The curves are designated with the respective deflection angle, which varies between 28° and 32°. For comparison, a curve for an arrangement having a single 45° inclination, thus an arrangement according to FIG. 1, is also shown. This curve is identified by the designation "45°".

The conductor track arrangements were based on the following model parameters: The carrier on which the conductor track arrangement designed as a microstrip is applied consists of aluminum nitride ceramic having a permittivity of 8.8. The dielectric loss factor tan(☐) is 0.001. The conductor tracks, in particular the signal conductor 10, are manufactured from gold. The conductivity of the gold conductor track is 41000000 Siemens/m.

As is apparent on the basis of the curves, the single 45° inclination displays the highest losses. At high signal frequencies between 30 GHz and 45 GHz, the arrangement having a deflection angle of 30° displays particularly low loss.

As is apparent in FIG. 13, the magnitudes of the dispersion parameter $S_{11}$, thus in particular of the return loss, are particularly low. All curves are below −15 dB, even below −20 dB, so that according to one embodiment of the invention without restriction to the examples shown, it is generally provided that the deflection area 4 is formed so that the absolute value mag($S_{11}$), or the magnitude of the dispersion parameter $S_{11}$ over the observed frequency range, in particular from 1 GHz to 50 GHz, is less than −15 dB, preferably less than −20 dB, preferably less than −25 dB.

To be able to assess the angle dependence of the reflection loss in the entire high-frequency range, the losses mag(S11 (f)) for frequencies $f_n$ in the range from 1 GHz to 50 GHz were summed:

$$S = \sum_{f_n=1\,GHz}^{50\,GHz} mag(S_{11}(f_n)) \quad (3)$$

Figure 14:
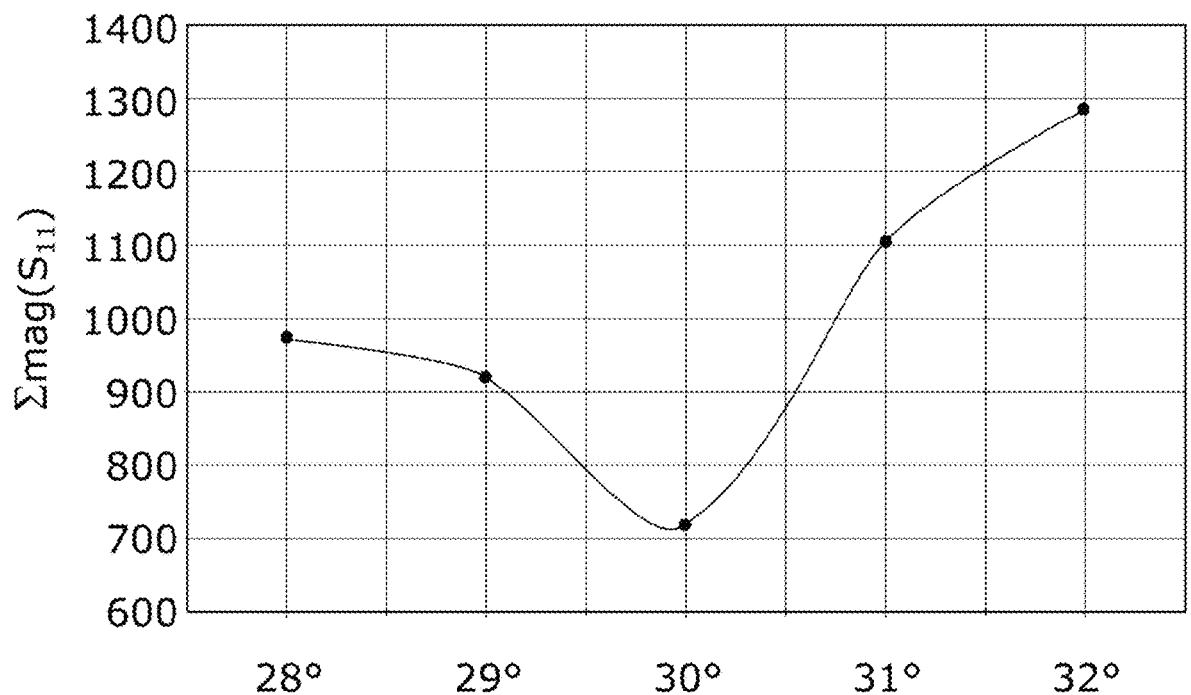
FIG. 14 shows a diagram having the return flow summed in a broad frequency range as a function of the deflection angle.

The result of this summation is shown in FIG. 14. FIG. 14 shows a diagram having the amplitudes summed in the frequency range from 1 GHz to 50 GHz in steps of 220 MHz, or absolute values mag($S_{11}$) of the return loss $S_{11}$ for the various deflection angles from 28° to 32°. The course of the curve shown displays a clear minimum for a deflection angle of 30°. The summed return loss at the deflection section according to equation (3) is less than 1000 at deflection angles in the range from 28° to 30°. Such values can also be achieved with other geometries of deflection areas having multiple deflection sections along an edge. Therefore, in general it is provided in one embodiment that the deflection area 4 is shaped so that the sum S of the dimensions of the dispersion parameter S11 for frequencies at the interval of 1 GHz according to equation (3) in a frequency range from 1 GHz to 50 GHz is less than 1000.

The following advantages are achieved by this selection of the deflection angles and unequal length of the deflection sections:

In comparison to a single 45° deflection according to the prior art, a better control of the capacitance of the corner of the conductor track in the deflection area is achieved. This increases the bandwidth of the signal used for data transmission. Due to the minimum around a deflection angle of 30°, it is generally provided according to one embodiment that the deflection angle of an edge 2, 3, preferably the outer edge 3 at the transition from one leg 13, 14 of the signal conductor 10 to the adjoining deflection section 5, is between 29° and 31°.

This disclosure also relates in general to electronic component parts which are installed in a housing and are connected to the conductor track arrangement described here to transmit high-frequency electrical signals. One part of the housing is typically a socket, on which the electronic component is fastened and via which the signal feed takes place. In general, for this purpose a socket 20 for an electronic component is provided with an electronic component part 28 and a conductor track arrangement 1 according to this disclosure, wherein the socket has an electrical feedthrough 22, and wherein the electronic component part 28 and the electrical feedthrough 22 are both connected to the signal conductor 10 of the conductor track arrangement 1, so that electrical signals are conducted from the feedthrough 22 via the signal conductor 10 to the component part 28. In particular, feedthrough 22 and electronic component part are each connected to one of the legs 13, 14, so that the electrical signals flow in succession through one leg, the deflection area 4, and then the other leg.

Furthermore, this disclosure also relates to an electronic component having a socket. The electronic component 30 is a component having a housing, in which the electronic component part 28 and the conductor track arrangement 1 are enclosed. In particular, the housing can comprise a socket 20 and a cap 31.

Figure 15:
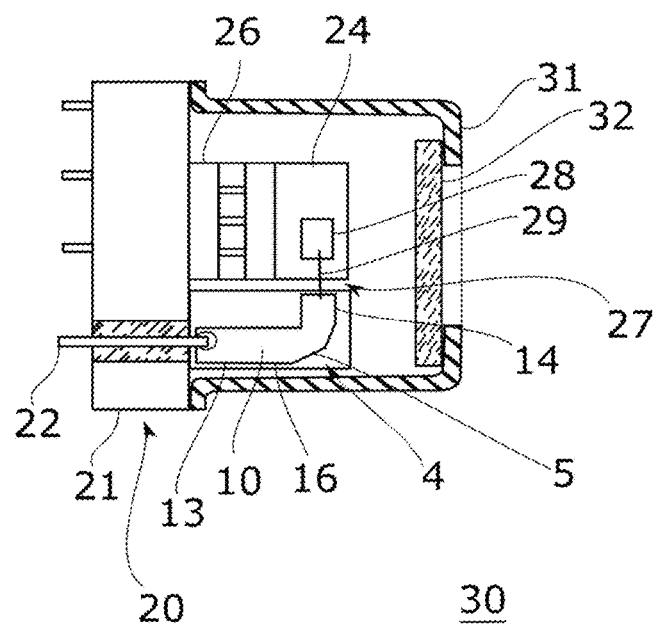
FIG. 15 shows an electronic component.

FIG. 15 schematically shows an electronic component 30 having such a socket 20. An optoelectronic converter is preferably used as an electronic component part 28 in the electronic component 30. The electronic component part 28 can thus be a laser diode to convert high-frequency electrical signals for the optical signal transmission. Vice versa, the electronic component part 28 can also be a photodiode to convert optically transmitted data back into electrical signals.

The housing of the electronic component 30 can be, for example, a TO housing (TO="transistor outline"). For an optoelectronic converter as an electronic component part 28, the cap 31 connected to the socket 20 can have a window 32.

For example, the window 32 can be connected to the sheet-metal of the cap 31 by means of a glass solder.

Depending on the direction in which the signals are converted, a signal conduction direction is defined. In electro-optical converters such as a laser diode, the signal conduction direction is along the signal conductor 10 from the feedthrough 22 out to the laser diode. To achieve a good reflection loss, it is generally particularly preferred here, without restriction to the illustrated example, if the deflection section 5 adjoining the leg 13 through which the electrical signals flow first has a deflection angle of less than 45°, preferably less than 40°, to the edge, preferably to the outer edge 3 of the leg 13. Which leg 13, 14 the electrical signals flow through first is determined in this case by the signal conduction direction. Preferably, the leg 13 is the one through which electrical signals flow first as defined by the signal flow direction.

A deflection of the signal conductor 10, as is described in this disclosure, can be advantageous, for example, if the electronic component part 28 is to be thermally decoupled from the socket 20. For this purpose, it can be provided according to one embodiment that the electronic component 28 is arranged on a platform 24, which is cooled using a thermoelectric cooler 26, wherein the carrier 16 having the signal conductor 10 is arranged adjacent to the platform 24 and separated by a gap 27 from the platform 24. The gap 27 prevents a thermal contact to the carrier 16 of the conductor track arrangement 1. Due to this arrangement, however, the signal conductor then extends adjacent to the thermoelectric cooling element 26 and the platform. The deflection is then used to guide the signal conductor 10 in the direction to the electronic component part 28, as is apparent on the basis of the example of FIG. 15.

The gap 27 can then be bridged using a bond wire 29 attached at one end of the signal conductor 10, in particular at the end of the leg 14. The electrical connection to the electronic component part 28 takes place as shown in the example from the feedthrough 22 to a first leg 13 of the signal conductor 10, via the deflection area 4 to the second leg 14 up to the end of the signal conductor 10, which is typically also the end of the second leg 14, and from the end of the signal conductor 10 via the bond wire 29. The bond wire 29 can directly contact the electronic component part 29 or can establish the connection to a further conductor track on the platform 24. In the example shown in FIG. 15, the electronic component part 28 is directly connected to the bond wire 29.

It is apparent to a person skilled in the art that the conductor track arrangement 1, as well as the socket 20 having the conductor track arrangement and the electronic component formed using the socket 20, are not restricted to the specially illustrated examples. Thus, an additional leg can also join one or both legs 13, 14 via a further deflection area. In this way, the signal conductor 10 can be U-shaped, for example, or the further leg extends laterally offset in parallel to the first leg. Furthermore, it is also conceivable to provide two or more signal conductors 10 on the carrier 16. According to one embodiment, these signal conductors 10 can extend in a coplanar manner on one of the sides of the carrier 16, wherein a common ground conductor is provided on the opposite side.

Figure 16:
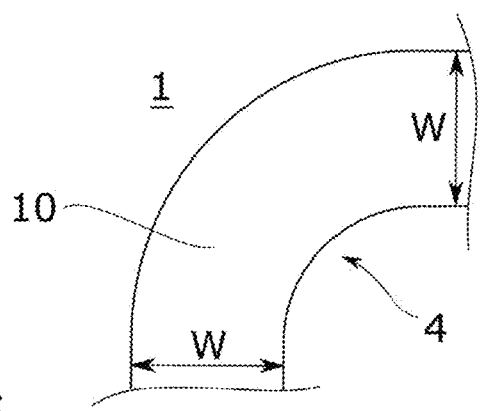
FIG. 16 shows a conductor track arrangement having two curved edges, in which the signal conductor has a constant width.

Signal conductors are known from the prior art in which both edges are curved, however, their cross-sectional widths of the conductor track do not change during the curvature, as is shown in FIG. 16, for example. Due to the constant cross-sectional width, the curvature has an elevated capacitance, which changes the line impedance. A mismatch of the line is linked thereto, which results in a higher reflection loss of the signal in the curvature. This is avoided in that the width W of the signal conductor 10 changes in the deflection area 4, by which the capacitance is adapted to the required impedance, in particular reduced.

Figure 17A:
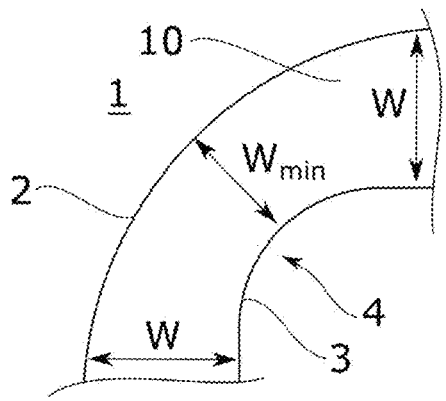
FIGS. 17a and 17b show conductor track arrangements having two curved edges, in which the signal conductor is narrower in the deflection area than at the ends of the signal conductor.
Figure 17B:
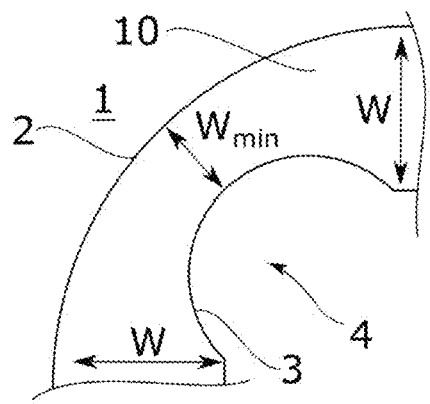

FIGS. 17a and 17b therefore show a conductor track arrangement 1 having two curved edges, in which the signal conductor 10 is narrower in the deflection area 4 than at the ends of the signal conductor 10. At the beginning, or at one end and at the other end of the line curvature, or of the deflection area 4, in particular of the signal conductor 10, the signal conductor 10 has the width W. The line is thus adapted at the beginning and at the end to the required line impedance. The width W preferably changes continuously over the angle of curvature of preferably 0° to 90°. The signal conductor 10 preferably has its minimum width $W_{min}$ in the area of half the angle of curvature between 35° and 60°. In the case of an asymmetrical formation of the deflection area, the minimum width $W_{min}$ can also be located above 60° or below 35°, however. In the further course, the width W increases again, to reach the width W again at the end at 90°. In this way, a better transmission behavior at high frequencies is achieved in comparison to conductor tracks from the prior art, which is shown in FIG. 16, for example.

The signal conductor 10 having two curved edges and a narrower width W in comparison to the ends in the deflection area can be designed differently. Preferably, the curvature of the inner edge 3 and the curvature of the outer edge 2 have an ellipsoidal or circular contour. It is therefore conceivable that the center point of the circle formed by the inner edge 3 is arranged closer to the signal conductor 10 than the center point of the circle formed by the outer edge 2.

In this case, as shown in FIG. 17a, the segment of a circle formed by the outer edge 2 can be less than 90°, or can preferably also be greater than 90°. Similarly, the angle between the inside of the outer edge 2 and a line defined by the width W of the signal conductor 10 at the beginning of the curvature of the outer edge 2 can have a value of 90° or less. The angle between the inside of the inner edge 3 and a line defined by the width W of the signal conductor 10 at the beginning of the curvature of the inner edge 3 can have a value of 90° or less. It is possible here that the beginning of the curvature of the outer edge 2 is arranged offset in the direction of the length of the signal conductor 10 in relation to the beginning of the curvature of the inner edge 3, preferably in such a way that at least the outer edge and/or the inner edge 3 has at least one straight, in particular non-curved section in the deflection area 4.

FIG. 17b shows a different geometry of the signal conductor 10, wherein the angle between the inside of the outer edge 2 and the line defined by the width W of the signal conductor 10 at the beginning of the curvature of the outer edge 2 has a value of 90° or more. The segment of a circle formed by the outer edge 2 is then less than 90° or preferably exactly 90°. The angle between the inside of the inner edge 3 and the line defined by the width W of the signal conductor 10 at the beginning of the curvature of the inner edge 3 can have a value of 90° or more. In this case, the segment of a circle formed by the inner edge 3 is greater than 90°, preferably greater than 130°, preferably greater than 180°. It can be conceivable that the beginning of the curvature of the outer edge 2 is arranged offset in relation to the beginning of the curvature of the inner edge 3, preferably in such a way that at least the outer edge and/or the inner edge 3 has a straight, in particular non-curved section in the deflection area 4.

Figure 18:
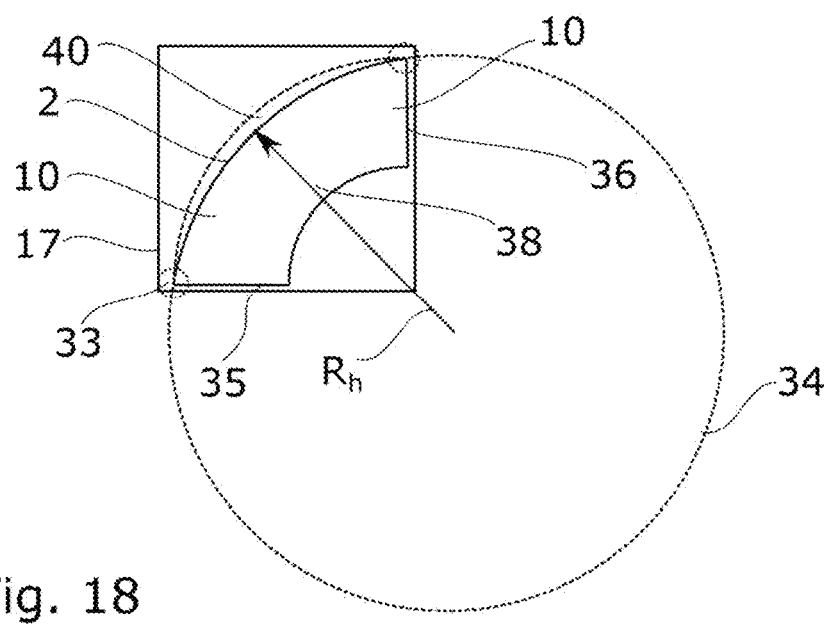
FIG. 18 shows a construction to ascertain a desired width of the signal conductor in the deflection area.
Figure 19:
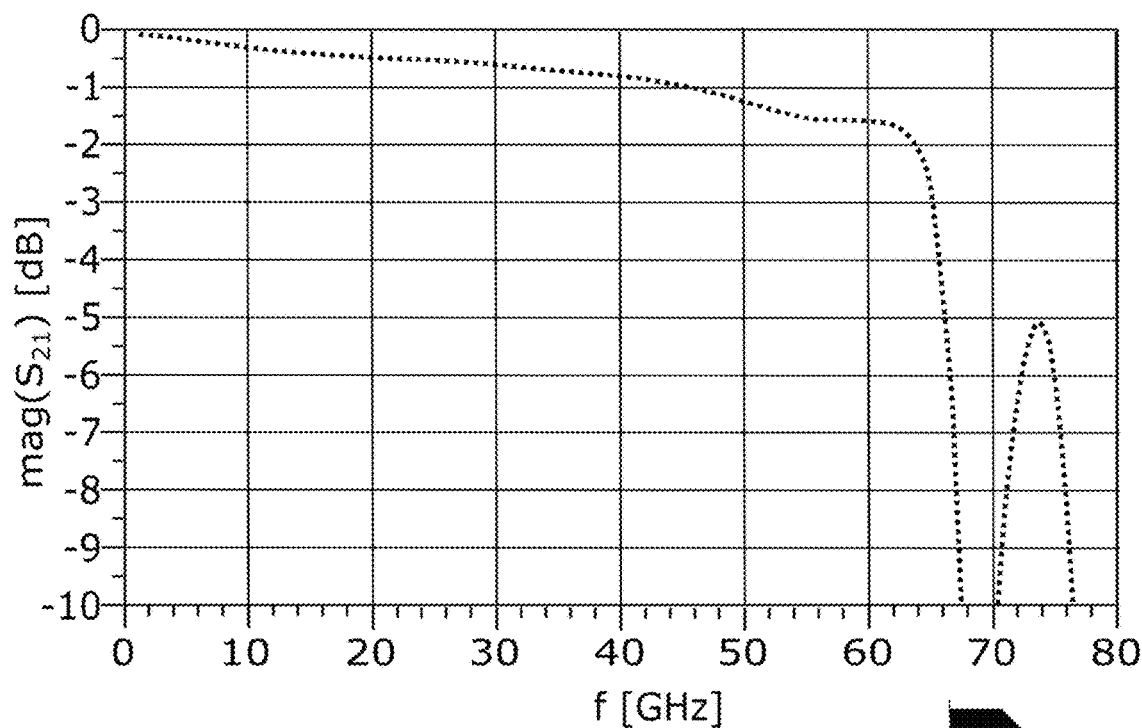
FIG. 19 shows the insertion loss as a function of the signal frequency for a signal conductor having a 45° inclination upon use in a transistor outline housing (TO housing).
Figure 20:
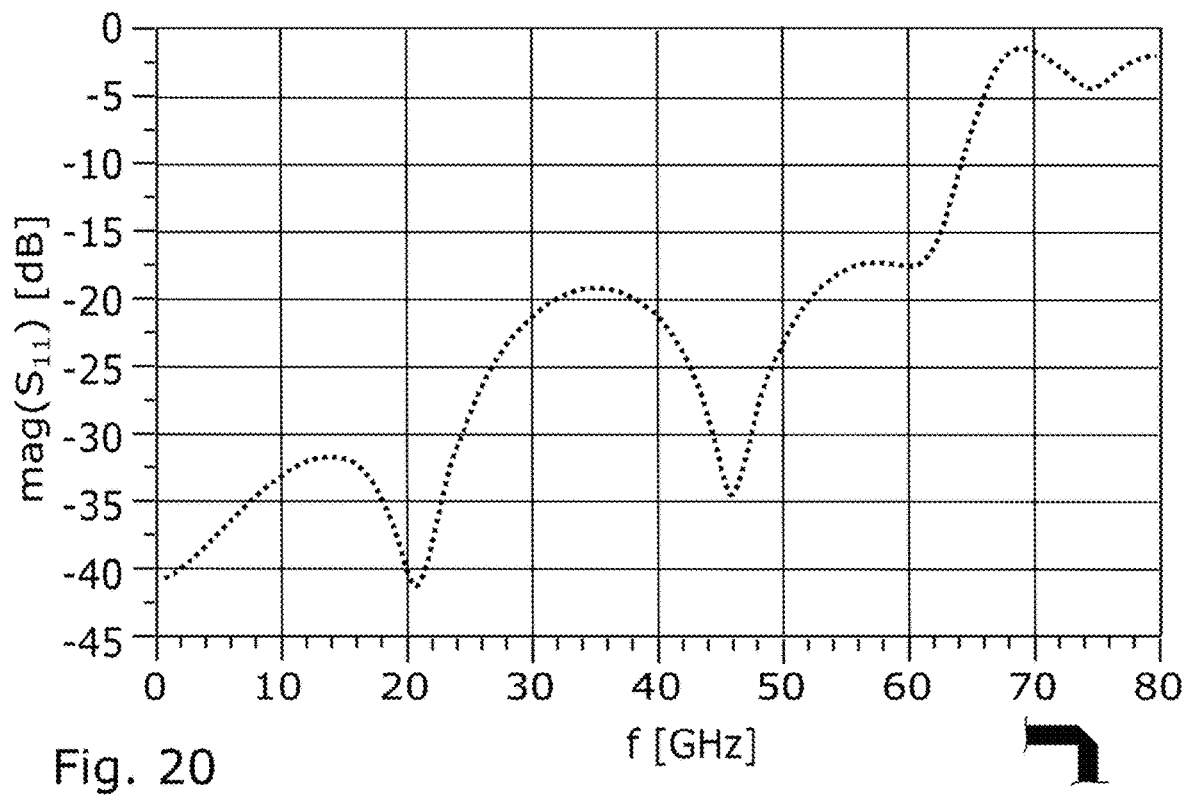
FIG. 20 shows the reflection loss as a function of the signal frequency for a signal conductor having a 45° inclination upon use in a TO housing.

FIG. 18 shows how a preferred width $W_{min}$ can be ascertained in the deflection area 4. A construction is depicted having a conductor track as presented in FIG. 16, having constant line width W in the line curvature in the deflection area 4. Furthermore, an auxiliary circle 34 is shown. The center point of the auxiliary circle 34 is defined in that the distance of the circle center point to the outer contour or edge points 33 of the line curvature is equal at the beginning or one end 35 and at the other end 36 of the curvature or of the deflection area 4. The two contour points 33 are circled by dashed lines. If the radius $R_h$ of the auxiliary circle 34 is greater than the radius of the outer edge 2 of the signal conductor 10, the auxiliary circle 34 cuts off a crescent-shaped area 40 from the line curvature. A preferred line curvature now results by subtraction of the crescent area 40 from the line curvature. The crescent area 40 consists of two circle segments of different radii. The distance of these two circle segments is zero at the angles of curvature 0° and 90° and is maximum at the angle of curvature of 45°. This means that at 0° and 90°, the line curvature is not cut. At the beginning 35 and at the end 35 of the deflection area 4, the width W of the signal conductor 10 remains the same or unchanged. In particular at the angle of curvature 45°, in contrast, most of the line curvature is cut off. The width $W_{min}$ of the signal conductor 10 is preferably minimal there.

Depending on the carrier material, the desired line impedance, and the curve radius of the line curvature, a matching radius $R_h$ of the auxiliary circle 34 is ascertainable by simulations. This typically represents a compromise from the shift of the limiting frequency of the higher-order waves and the required reflection loss. However, it is also conceivable that instead of the auxiliary circle 34, an ellipse or a parabola is used. However, it is important in this case that the auxiliary area is formed by a steady function to avoid abrupt changes in that the outer edge of the signal conductor 10 intersects the auxiliary surface at at least two points. On the basis of such simulations and their results, the advantage of the width $W_{min}$ of the signal conductor 10 reduced in the deflection area 4 is to be proved hereinafter.

It is apparent on the basis of FIGS. 17a, 17b, and 18 that a favorable form of the signal conductor 10 can be obtained without restriction to the specially illustrated examples if the outer edge and the inner edge represent segments of non-concentric curves, in particular non-concentric circles or ellipses. Accordingly, the curvature or the curve course of the inner edge 3 and the curvature of the outer edge each have a center, wherein the center of the curvature of the inner edge 3 and the center of the curvature of the outer edge are arranged offset to one another, in particular so that the curvature of the inner edge 3 and the curvature of the outer edge 2 are formed eccentrically. In particular, for this purpose the center of the curve of the inner edge 3 can be arranged closer to the signal conductor 10 than the center of the curve of the outer edge 2. This is also the case in both configurations of FIGS. 17a and 17b. In the examples, this offset of the centers lies along the angle bisectors 38 of the deflection, which in the case of outer and inner edges in the form of circular segments, results in a mirror-symmetrical shape of the deflection area with respect to the angle bisector 38, preferably also of the entire signal conductor 10.

In FIGS. 19, 21, 23, 25, and 27, the insertion loss and in FIGS. 20, 22, 24, 26, and 28 the reflection loss of the 90° line angle known from the prior art having a 45° inclination 8, as shown in FIG. 1, and the line curvature having constant line width W from FIG. 16 are therefore shown. The insertion loss and the reflection loss which can be achieved using the design according to the invention of the curvature of the signal conductor 10 in the deflection area 4, wherein both edges 2, 3 are curved and the width $W_{min}$ of the signal conductor 10 in the deflection area 4 is less than the width W at the ends 35, 36 of the deflection area 4, are also shown. For better illustration and comparability of the diagrams, matching pictograms were introduced in each case, which show the respective one of the above-mentioned three designs of the signal conductor 10 using which the illustrated results were achieved. The pictograms correspond here to the embodiments of the signal conductor 10 shown in FIGS. 1, 16, 17a, and 17b.

Figure 21:
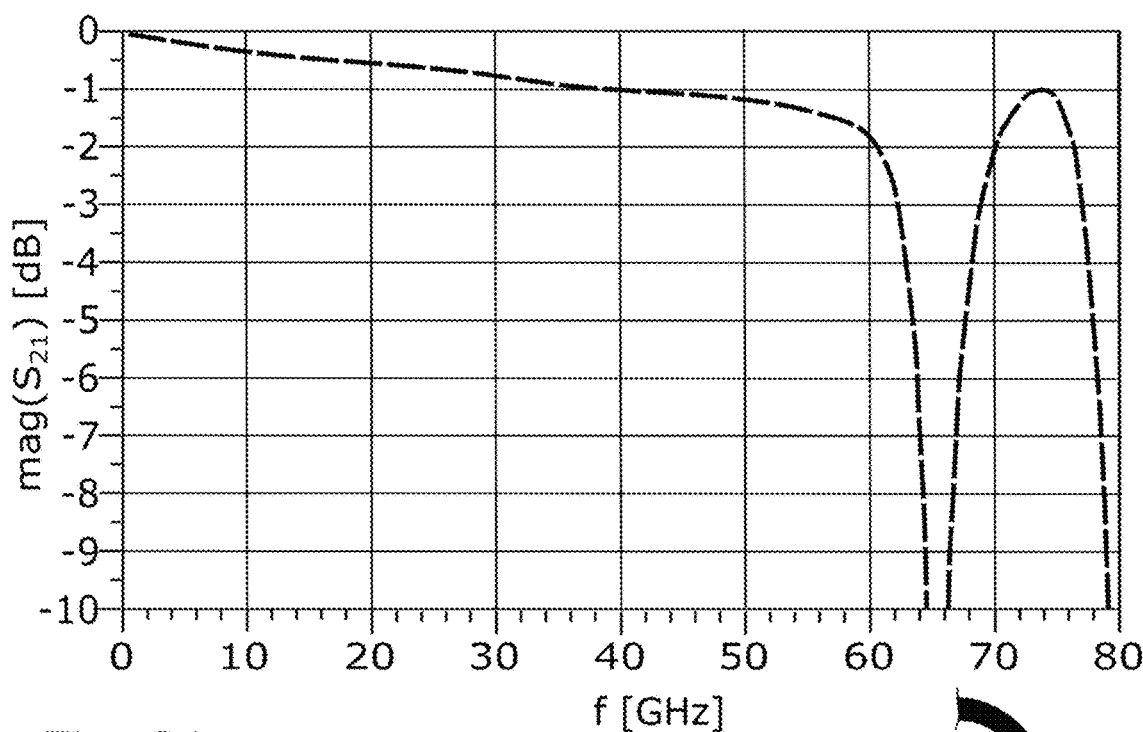
FIG. 21 shows the insertion loss as a function of the signal frequency for a signal conductor having constant line width and curved edges upon use in a TO housing.
Figure 22:
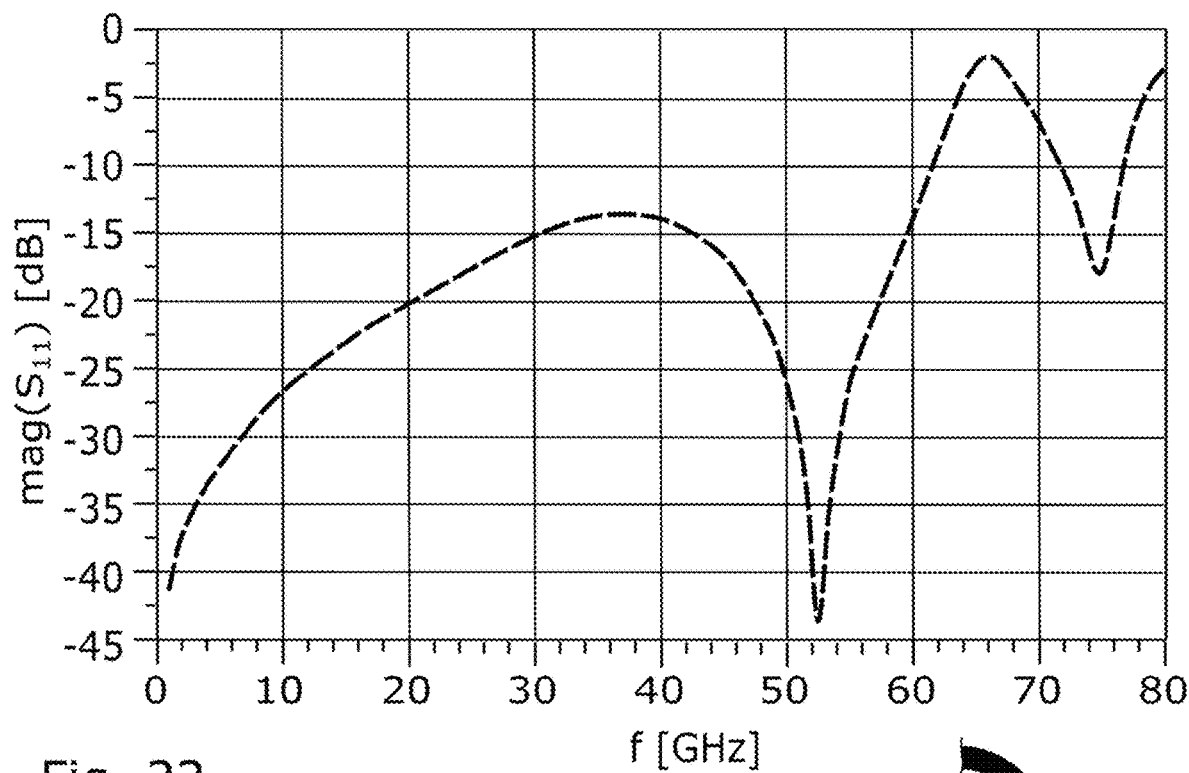
FIG. 22 shows the reflection loss as a function of the signal frequency for a signal conductor having constant line width and curved edges upon use in a TO housing.
Figure 23:
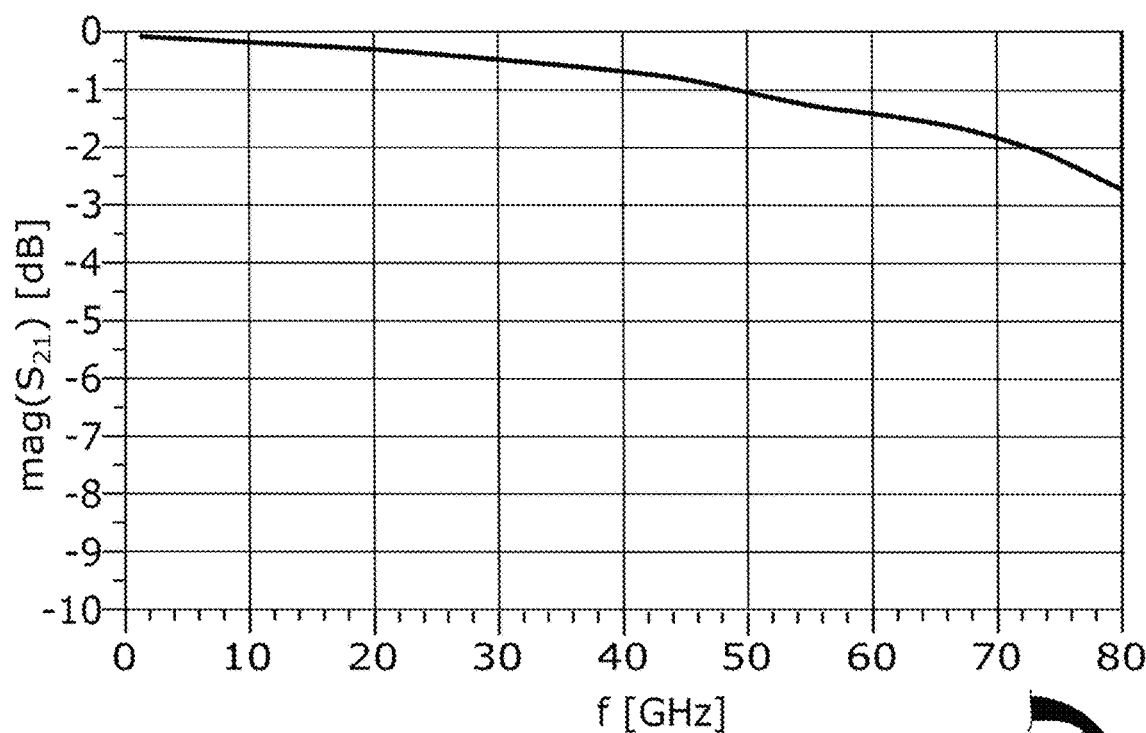
FIG. 23 shows the insertion loss as a function of the signal frequency for a signal conductor having variable line width and curved edges upon use in a TO housing.
Figure 24:
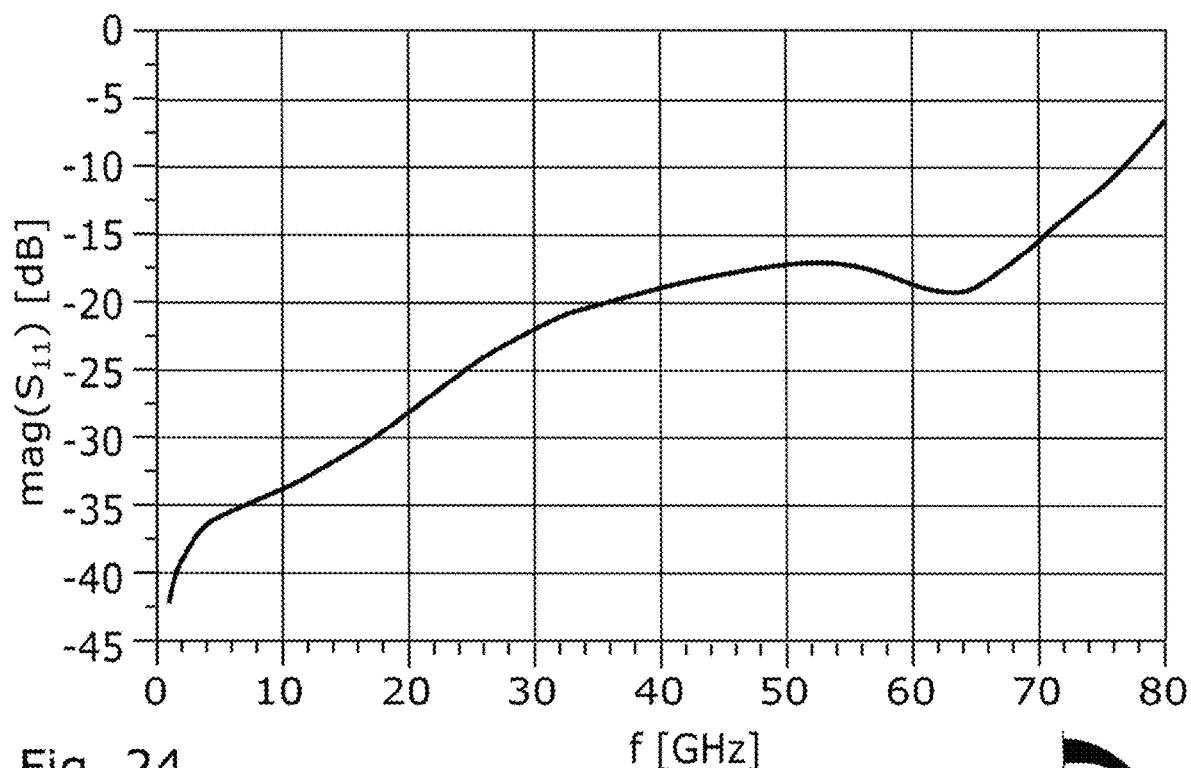
FIG. 24 shows the reflection loss as a function of the signal frequency for a signal conductor having variable line width and curved edges upon use in a TO housing.

FIGS. 19 to 24 show for this purpose the course of the dispersion parameters $S_{21}$ and $S_{11}$ describing the signal loss on a transistor outline header (TO header) having a signal line connected to a feedthrough. The line curvature according to the invention in FIGS. 23 and 24 shows significantly better properties at high frequencies than the line angle (FIGS. 19 and 20) or curvature known from the prior art having constant line width W (FIGS. 21 and 22). In the insertion loss, singular points mark the limiting frequencies for higher-order waves here. At the two known deflections of a signal line 10, the lower limiting frequency is at approximately 65-70 GHz. In the case of the line curvature having reduced width $W_{min}$ and curved edges 2, 3, the limiting frequency is advantageously at greater than 80 GHz, or is no longer in the measuring range. The limiting frequency is thus shifted toward significantly higher values by the reduced width $W_{min}$ in the deflection area 4 and the curvature of the edges 2, 3, so that the fundamental wave is no longer impaired at relatively high frequencies by higher-order waves, as is possible with signal conductors from the prior art.

Since the line curvature with constant conductor track width W cannot compensate for the elevated capacitance of the corner, the reflection loss overall is greater than that of the 90° line angle with 45° inclination. In the case of the line curvature with reduced width $W_{min}$ and curved edges 2, 3, however, the elevated capacitance can be compensated for very well and therefore also displays improved reflection loss in comparison to the 45° inclination 8 or the constant width W. The diagrams show that the line angle having 45° inclination 8 and the line curvatures having constant width is no longer to be used for undisturbed signal transmission above the limiting frequency.

To show the breadth of application of a signal conductor 10 having improved line curvature having reduced width $W_{min}$ and curved edges 2, 3, the simulation was carried out using two different carrier circuit boards.

Figure 25:
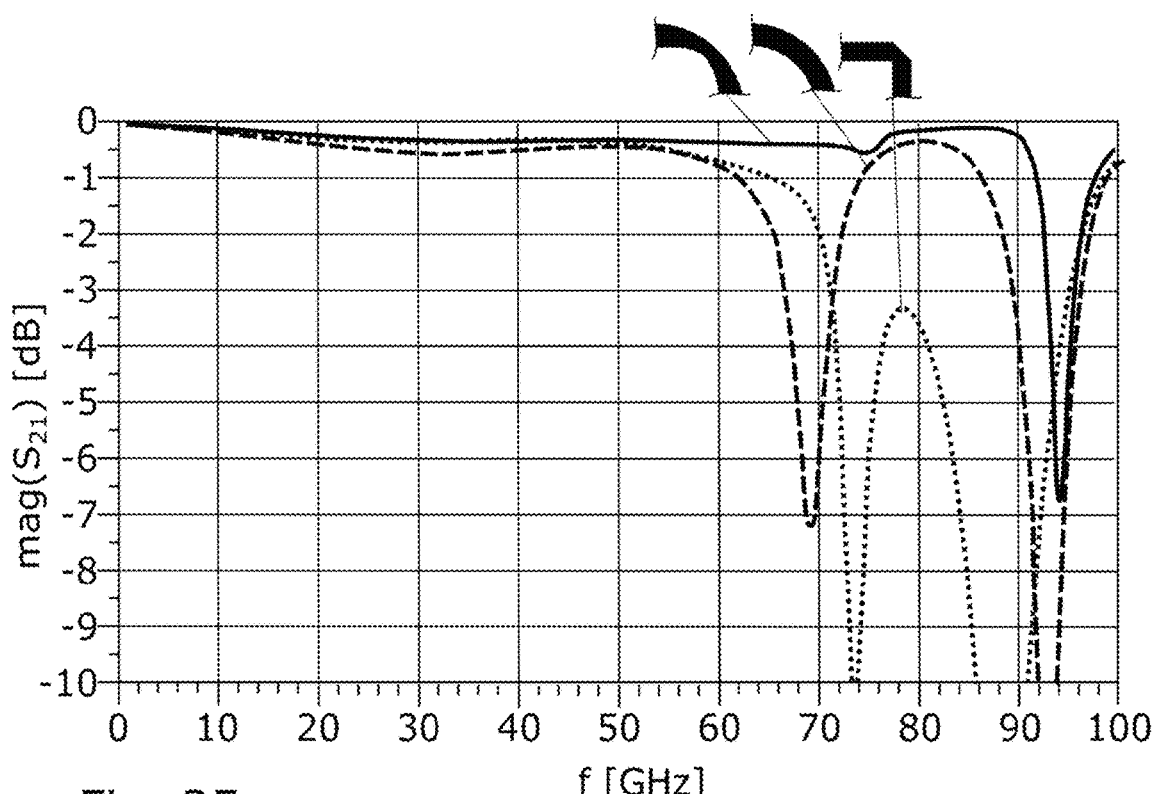
FIG. 25 shows the insertion loss as a function of the signal frequency for various signal conductor geometries on a thick submount.
Figure 26:
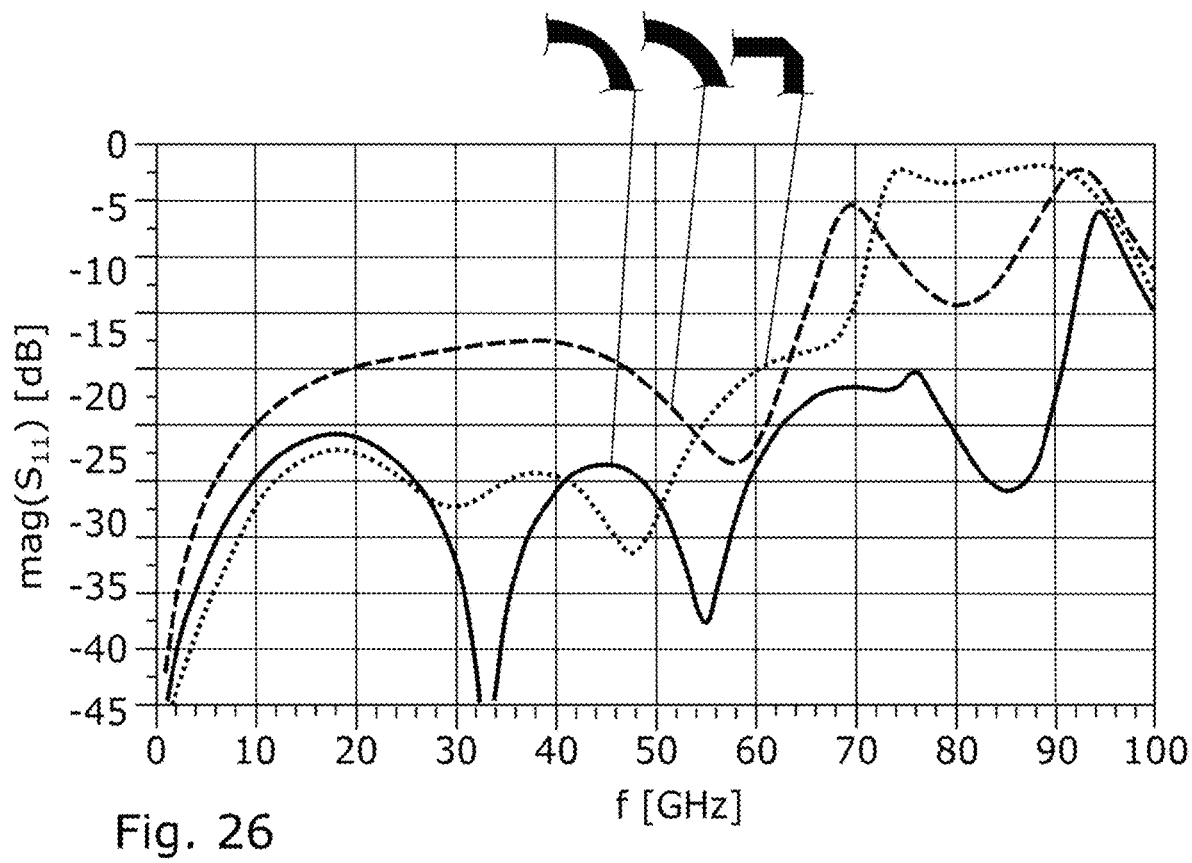
FIG. 26 shows the reflection loss as a function of the signal frequency for various signal conductor geometries on a thick submount.

In FIGS. 19 to 24 and also the diagrams of FIGS. 25 to 28, the frequency profiles of the dispersion parameters for the various shapes of the signal conductors 10 are identified on the basis of the line representation. The frequency profiles on the known arrangement having a 45° inclination are each represented by a dotted line, the profiles on a curved signal conductor 10 having constant width W by a dashed line, and the profiles on a curved signal conductor 10 having variable width W by a solid line. In addition, the respective curves are identified by pictograms which represent the various conductor track shapes. In FIG. 25, the insertion losses of the simulation results are shown, in which the simulation was carried out using a carrier circuit board or a submount 17 having a thickness or height of 0.2 mm. FIG. 26 shows the corresponding results of the reflection loss for the properties mentioned for FIG. 25.

Figure 27:
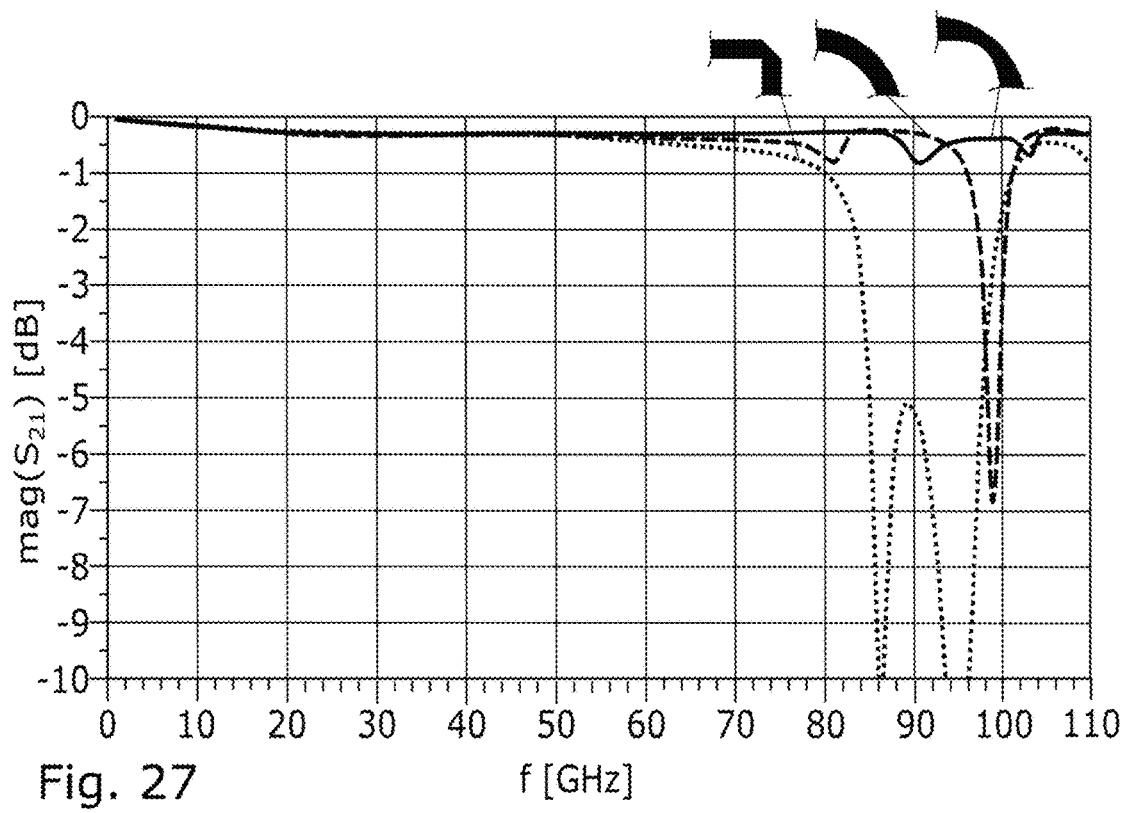
FIG. 27 shows the insertion loss as a function of the signal frequency for various signal conductor geometries on a thin submount.
Figure 28:
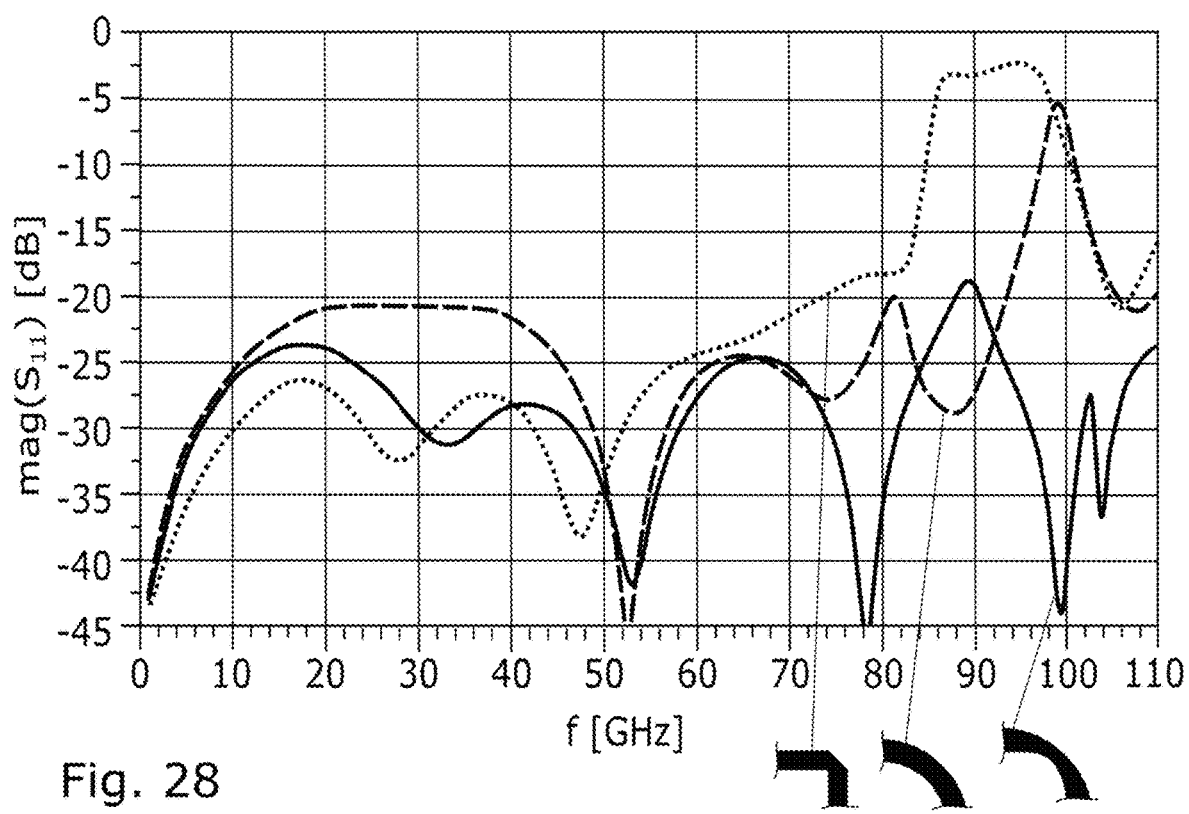
FIG. 28 shows the reflection loss as a function of the signal frequency for various signal conductor geometries on a thin submount.

FIG. 27 shows the insertion loss using a submount 17 having a height of 0.15 mm. FIG. 28 shows the corresponding results of the reflection loss for the properties mentioned for FIG. 27.

The simulations presented in FIGS. 25, 26 and 27, 28 accordingly differ in typical values of the height, or the thickness of the submount 17 and the width W of the signal conductor 10, for an application in TO. It is clearly apparent in FIGS. 25 to 28 that the limiting frequency for the excitation of higher-order waves with a 45° inclination and a constant conductor track width W is already at approximately 70 GHz, wherein the limiting frequency upon use of a thinner submount 17 is between 80 and 100 GHz. The limiting frequency with a signal conductor 10 having reduced width $W_{min}$ and curved edges 2, 3 is significantly higher in all cases, in contrast. The limiting frequency is increased by approximately 20 GHz or more here. In the case of the thin submount, a very minor inflection in the insertion loss is recognizable at approximately 90 GHz, which indicates a limiting frequency that can be minimized to insignificance, however, by suitable selection of the width $W_{min}$. Improved values are also clearly recognizable in the reflection loss in comparison to a 45° inclination and a constant conductor track width W.

FIG. 29 schematically shows a signal conductor 10 having reduced width $W_{min}$ and curved edges 2, 3 in use with a further electronic component having a socket 20 and its base 21. An electronic component, preferably an optoelectronic converter, in particular a laser diode or a light sensor, can be provided as the electronic component part 28, as is also described in FIG. 15. The electronic component part 28, without restriction to the example shown here, can be connected to two signal conductors 10, which can each be electrically connected to a pin for further signal transmission. To achieve good reflection loss, it is generally advantageous if in each case one and 35 of the deflection area or the signal conductor 10 is electrically coupled to a pin and another end 36 is electrically coupled to the component part 28. The deflection is typically used to lead the signal conductor or conductors 10 from the pin in the direction to the component part 28.

The signal conductors 10 are preferably electrically separated or decoupled from one another, for example by a gap 27. At least one signal conductor can preferably be electronically connected to the component part 28 using at least one bond wire. It is typically provided that the other signal conductor is coupled directly, in particular without a bond wire, to a terminal of the component part. A deflection of the signal conductor 10, as is described in this disclosure, can be advantageous, for example, when the electronic component part 28 is to be thermally decoupled from the socket 20, as shown in FIG. 15. For this purpose, it can be provided that the component part 28 is arranged on a platform 24, which is cooled using a thermoelectric cooler 26. However, it is preferred, in contrast to the illustration in FIG. 15, for the electronic component part 28 to be cooled without a thermoelectric cooler 26 and in particular to be thermally coupled to the platform 24. Furthermore, a submount 17 or a carrier 16 is preferably arranged on the platform 24, on the top of which the signal conductor or conductors 10 are arranged. On the bottom of the carrier 16, in particular with electrical contact to the platform 24, a ground conductor is arranged for the purpose of grounding, so that the conductor track arrangement 1 can be designed as a microstrip line or also as a CBCPW arrangement.

The conductor track arrangement 1 or the signal conductor or conductors 10 have a deflection area 4, wherein the width $W_{min}$ in the deflection area 4 is less at least in sections than the width W at at least one of the ends 35, 36 of the deflection area 4. The edges 2, 3, in particular the outer edge 2 and inner edge 3 of at least one signal conductor 10, preferably both signal conductors 10, are preferably curved at least in sections, in particular continuously. The curvature of the inner edge 3 and the curvature of the outer edge 3 is preferably formed eccentrically, so that the radius of the curvature of the outer edge 2 is greater than the radius of the curvature of the inner edge 3. The deflection area 4 can extend from one end to the other end of the signal conductor or conductors.

To understand the mode of operation and in particular the effect of the above-described conductor track arrangement, the occurrence of higher-order waves on a microstrip line, as is described, for example, in FIGS. 9 and 29, will be briefly explained hereinafter. FIGS. 30a, 30b, and 30c show for this purpose a microstrip line in cross section and the field lines 42 forming between the signal conductor 11 and the ground conductor 11 arranged opposite thereto on the submount 17. The submount 17 has a height h, which is small in relation to ¼ of the wavelength. For this reason, no taller waves exist in the vertical direction. However, higher-order waves can be capable of propagating in the horizontal direction if the width W is in the order of magnitude of a multiple of half the wavelengths (n λ/2). In this case, further standing waves can form in the transverse direction. There is therefore a limiting frequency from which higher-order waves propagate or can exist. Higher-order waves can also be excited by disturbances of the signal conductor 10.

The microstrip line has an inhomogeneous material filling and therefore does not carry solely transverse-electromagnetic waves (TEM wave). However, the fundamental waves behave over broad frequency ranges nearly like a TEM wave and are therefore also designated as quasi-TEM waves. These can be used well for signal transmission. In the case of these fundamental waves or quasi-TEM waves, the field lines of the electrical field (E field), as shown in FIG. 30a, are directed in the same direction over the cross section of the signal conductor 10 or over the width W of the signal conductor 10, thus are constant. The field lines of the higher-order waves change their direction in contrast over the width W of the signal conductor 10, so that the E field disappears between such direction changes. FIGS. 30b and 30c show the field lines of the two first harmonics or higher-order waves for this purpose.

The fundamental waves and all higher-order waves are referred to as natural waves of the signal conductor 10. On an undisturbed line, the natural waves move independently from one another and do not mutually interfere. In the event of interference, for example a direction change or a bend of the signal conductor, coupling of the natural waves occurs, thus the fundamental waves and the higher-order waves. The properties of the fundamental waves change in this way as soon as a higher-order wave propagates.

The above-described microstrip line has the advantage that it has a simple design in comparison to more complex conductor track systems, such as CBCPW arrangements, and the properties of the natural waves are decisively influenced by the geometry of the signal conductor 10, in particular by the curvature and the width W, or the cross section of the signal conductor 10, and by the thickness of the submount 17 or of the carrier circuit board of the signal conductor 10. Without restriction to the examples discussed here, this relationship will be explained on the basis of several exemplary values. The limiting frequency of the higher-order waves is deeper the greater the width W of the signal conductor 10 is. If the line impedance is approximately half of the otherwise typical 50Ω, thus only 25Ω, with identical carrier circuit board, the 25Ω line is three times wider than a 50Ω line. The limiting frequency for higher-order waves is therefore a third lower in a 25Ω line than in a typical 50Ω line.

As shown in FIGS. 19 to 28, the limiting frequency of the higher-order waves can be shifted toward high-frequency values by the embodiments presented in particular in FIGS. 17a, 17b, 18, and 29, for example over 80 GHz, so that the fundamental waves, thus the signal line is disturbed little or is even not disturbed at all up to frequency values of 80 GHz, preferably up to 90 GHz, preferably even at values above 100 GHz.

LIST OF REFERENCE SIGNS

| | |
|---|---|
| 1 | conductor track arrangement |
| 2 | outer edge of the signal conductor 10 |
| 3 | inner edge of the signal conductor 10 |
| 4 | deflection area |
| 5 | deflection section of 2 |
| 6 | deflection section of 3 |
| 8 | inclination |
| 10 | signal conductor |
| 11 | ground conductor |
| 12 | corner |
| 13, 14 | leg |
| 16 | carrier |
| 17 | submount |
| 18 | gap in 11 |
| 20 | socket |
| 21 | base of 20 |
| 22 | feedthrough |
| 24 | platform |
| 26 | thermoelectric cooler |
| 27 | gap |
| 28 | electronic component part |
| 29 | bond wire |
| 30 | electronic component |
| 31 | cap |
| 32 | window |
| 33 | outer contour points |
| 34 | auxiliary circle |
| 35 | one end of the deflection area |
| 36 | other end of the deflection area |
| 38 | angle bisector |
| 40 | crescent-like area |
| 42 | field line |
| α | deflection angle |
| H | thickness of 1 |
| W | width of 10 |
| $W_{min}$ | minimal width of 10 at one end of 1 |
| D | $\sqrt{2} \times W$ |
| $R_h$ | radius of the auxiliary circle |
| X | inclination |

What is claimed is:

1. A conductor track arrangement for high-frequency signals, comprising:
    a carrier; and
    a layered signal conductor arranged on the carrier, the layered signal conductor is delimited by a first end, a second end, an inner edge, and an outer edge, the layered signal conductor changes direction in a deflection area, and the layered signal conductor has a minimum width in the deflection area, wherein at least one of the inner and outer edges has a curvature in the deflection area, and wherein the deflection area is between the first and second ends.

2. The conductor track arrangement of claim 1, wherein the minimum width is reduced in relation to a width of the layer signal conductor at an end of the layer signal conductor by a factor of 0.5 to 0.95.

3. The conductor track arrangement of claim 1, wherein both of the inner and outer edges have the curvature in the deflection area.

4. The conductor track arrangement of claim 3, wherein the curvature of the inner and outer edges each have a center, wherein the center of the curvature of the inner edge and the center of the curvature of the outer edge are offset in relation to one another.

5. The conductor track arrangement of claim 4, wherein the curvature of the inner and outer edges each have a center, wherein the center of the curvature of the inner edge and the center of the curvature of the outer edge are offset in relation to one another.

6. The conductor track arrangement of claim 1, wherein the curvature is a continuous curvature in the deflection area and/or is steady in the deflection area.

7. The conductor track arrangement of claim 1, wherein the layered signal conductor has a width that changes steadily in the deflection area.

8. The conductor track arrangement of claim 1, wherein the minimum width is within a middle third of the deflection area.

9. The conductor track arrangement of claim 1, wherein the minimum width is within a middle of the deflection area.

10. The conductor track arrangement of claim 1, wherein the deflection area extends from the first end to the second end.

11. The conductor track arrangement of claim 1, wherein the deflection area is formed asymmetrically.

12. The conductor track arrangement of claim 1, wherein the deflection area has a mirror axis along an angle bisector of a deflection angle.

13. A conductor track arrangement for high-frequency signals, comprising:
    a carrier; and
    a layered signal conductor arranged on the carrier; and
    a ground conductor arranged on the carrier, the layered signal conductor is delimited by a first end, a second end, an inner edge, and an outer edge, the layered signal conductor changes direction in a deflection area between two legs,
    wherein, in the deflection area, at least one of the inner and outer edges has at least two deflection sections that are at an angle to one another.

14. The conductor track arrangement of claim 13, wherein the angle is in a range of 75° to 105°.

15. The conductor track arrangement of claim 13, further comprising a feature selected from a group consisting of: a corner connecting the at least two deflection sections, an edge that merges via a corner into one of the at least two deflection sections, the at least two deflection sections having different lengths, one of the at least two deflection section is inclined counter to a deflection direction of the layered signal conductor, and the deflection area being formed asymmetrically.

16. The conductor track arrangement of claim 13, wherein the deflection area is shaped so that a sum $S=\Sigma_{f_n=1\ GHz}^{50\ GHz} \mathrm{mag}(S_{11}(f_n))$ of amplitudes mag ($S_{11}$) or a dispersion parameter ($S_{11}$) for frequencies at the interval of 220 MHz in a frequency range from 1 GHz to 50 GHz is less than 1000.

17. The conductor track arrangement of claim 13, wherein the deflection area is shaped so that an absolute value mag ($S_{11}$) or a magnitude of a dispersion parameter $S_{11}$ over a frequency range from 1 GHz to 50 GHz is less than −15 dB.

18. The conductor track arrangement of claim 13, wherein the conductor track arrangement is configured for a use selected from a group consisting of: a microstrip line, a coplanar waveguide, a CBCPW arrangement, a socket for an electronic component, an arrangement with a limiting frequency for the occurrence of higher-order waves is above 60 GHz, an arrangement with a limiting frequency for the occurrence of higher-order waves is above 70 GHz, and combinations thereof.

19. The conductor track arrangement of claim 13, wherein the carrier comprises a material selected from a group consisting of aluminum nitride ceramic, ceramic containing aluminum nitride, aluminum oxide ($Al_2O_3$), glass, and glass ceramic.

20. The conductor track arrangement of claim 13, wherein the ground conductor comprises a layered ground conductor arranged opposite to the layered signal conductor, wherein the layered ground conductor and the layers signal conductor have a distance therebetween with a feature selected from a group consisting of: the distance being in a range from 0.025 mm to 0.5 mm, the distance being in a range from 0.05 mm to 0.4 mm, the layered signal conductor having a width at the first or second end that is greater than the distance by a factor of 0.5 to 7.5, the layered signal conductor having a width at the first or second end that is greater than the distance by a factor of 0.6 to 5, a ratio of the distance to a difference of a width of the layered signal conductor at the first or second end and a minimum width of the layered signal conductor has a value from 0.5 to 2, and combinations thereof.

* * * * *